(12) United States Patent
Sella et al.

(10) Patent No.: US 12,375,033 B2
(45) Date of Patent: *Jul. 29, 2025

(54) SWITCHING DEVICES FOR A POWER CONVERTER

(71) Applicant: Solaredge Technologies Ltd., Herzeliya (IL)

(72) Inventors: Guy Sella, Bitan Aharon (IL); Yoav Galin, Raanana (IL); Meir Adest, Modiin (IL); Ilan Yoscovich, Givatayim (IL); Avi Rubinshtein, Hod Hasharon (IL); David Braginsky, Ashkelon (IL); Naseem Jamal, Jatt (IL); Reuven Savitzky, Hod HaSharon (IL); Ariel Cohen, Modiin (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

This patent is subject to a terminal disclaimer.

(21) Appl. No.: 17/591,889

(22) Filed: Feb. 3, 2022

(65) Prior Publication Data

US 2022/0158586 A1    May 19, 2022

Related U.S. Application Data

(63) Continuation of application No. 15/711,505, filed on Sep. 21, 2017, now Pat. No. 11,277,093.

(Continued)

(51) Int. Cl.
*H02S 40/30*    (2014.01)
*H02S 50/15*    (2014.01)
(Continued)

(52) U.S. Cl.
CPC .............. *H02S 40/30* (2014.12); *H02S 50/15* (2014.12); *H03K 17/968* (2013.01); *H03K 17/97* (2013.01);
(Continued)

(58) Field of Classification Search
CPC ....... H02S 40/30; H02S 50/15; H03K 17/968; H03K 17/97; H03K 2217/94063; H03K 2217/94068; H03K 17/95; Y02E 10/50
See application file for complete search history.

(56) References Cited

U.S. PATENT DOCUMENTS

| 5,216,246 A | 6/1993 | Weldman et al. |
| 6,262,496 B1 | 7/2001 | Lamar et al. |
| (Continued) | | |

FOREIGN PATENT DOCUMENTS

| CN | 101976961 A | 2/2011 |
| CN | 102590799 A | 7/2012 |
| (Continued) | | |

OTHER PUBLICATIONS

Dec. 2, 2022—CN Office Action—CN App. No. 201710854126.9.

(Continued)

*Primary Examiner* — Rexford N Barnie
*Assistant Examiner* — Rasem Mourad
(74) *Attorney, Agent, or Firm* — Banner & Witcoff, Ltd.

(57) ABSTRACT

Mounting an agent on a cover of on an enclosure of an electronic device such that changing a physical location of the cover changes a location of the agent. In response to a change in the physical location of the cover, detecting a change in location of the agent with a sensor. Reading a transmitted signal from the sensor by a controller and changing a status of the electronic device according to instructions from the controller, the instructions being configured according to the transmitted signal of the sensor.

20 Claims, 26 Drawing Sheets

Related U.S. Application Data

(60) Provisional application No. 62/486,550, filed on Apr. 18, 2017, provisional application No. 62/398,247, filed on Sep. 22, 2016.

(51) Int. Cl.
  *H03K 17/968* (2006.01)
  *H03K 17/97* (2006.01)
(52) U.S. Cl.
  CPC .............. *H03K 2217/94063* (2013.01); *H03K 2217/94068* (2013.01)

(56) References Cited

U.S. PATENT DOCUMENTS

| | | | |
|---|---|---|---|
| 6,400,267 | B1 | 6/2002 | Gordon-Levitt et al. |
| 9,312,701 | B1 | 4/2016 | Mor et al. |
| 9,368,959 | B2 | 6/2016 | Wright, Jr. et al. |
| 2004/0149550 | A1 | 8/2004 | Allen |
| 2004/0257068 | A1 | 12/2004 | Wolber et al. |
| 2007/0095634 | A1 | 5/2007 | Misuda |
| 2007/0210777 | A1 | 9/2007 | Cervera et al. |
| 2008/0173797 | A1 | 7/2008 | Sanford et al. |
| 2008/0232141 | A1 | 9/2008 | Artusi et al. |
| 2010/0263704 | A1* | 10/2010 | Fornage ............... H02S 40/32 439/153 |
| 2011/0291777 | A1 | 12/2011 | Stiltz et al. |
| 2012/0091824 | A1 | 4/2012 | Campolo et al. |
| 2012/0176732 | A1* | 7/2012 | Cosley ............... H05K 7/1432 361/622 |
| 2013/0015929 | A1 | 1/2013 | Bryan et al. |
| 2013/0069582 | A1* | 3/2013 | Kimoto ............... B60L 50/51 320/101 |
| 2013/0078853 | A1* | 3/2013 | Dinh ............... H02G 3/121 439/535 |
| 2013/0145938 | A1 | 6/2013 | Correale, Jr. |
| 2013/0315763 | A1 | 11/2013 | Neoh et al. |
| 2013/0342030 | A1* | 12/2013 | Meyer ............... G05B 9/02 307/328 |
| 2014/0375116 | A1* | 12/2014 | Deneszczuk ............... B60L 3/003 307/9.1 |
| 2015/0233980 | A1 | 8/2015 | Umetsu et al. |
| 2015/0295366 | A1* | 10/2015 | Futakuchi ............... G06F 1/16 439/620.21 |
| 2016/0037668 | A1 | 2/2016 | Yamanaka et al. |
| 2016/0101202 | A1* | 4/2016 | Gil ............... A61L 2/10 250/455.11 |
| 2016/0144728 | A1 | 5/2016 | Harper et al. |
| 2016/0145904 | A1 | 5/2016 | Lowder |
| 2017/0112014 | A1 | 4/2017 | Bialek |
| 2017/0154744 | A1 | 6/2017 | Hanson |
| 2018/0114660 | A1 | 4/2018 | Kupsch et al. |

FOREIGN PATENT DOCUMENTS

| | | |
|---|---|---|
| DE | 10156168 A1 | 7/2002 |
| EP | 1501259 A2 | 1/2005 |
| EP | 2192469 A2 | 6/2010 |
| EP | 2843370 A1 | 3/2015 |

OTHER PUBLICATIONS

Feb. 13, 2018—EP Search Report EP App No. 17191113.4.
Apr. 9, 2021—European Office Action—EP 17191113.4.
Jul. 7, 2023—European Search Report—EP App. No. 23166596.9.

\* cited by examiner

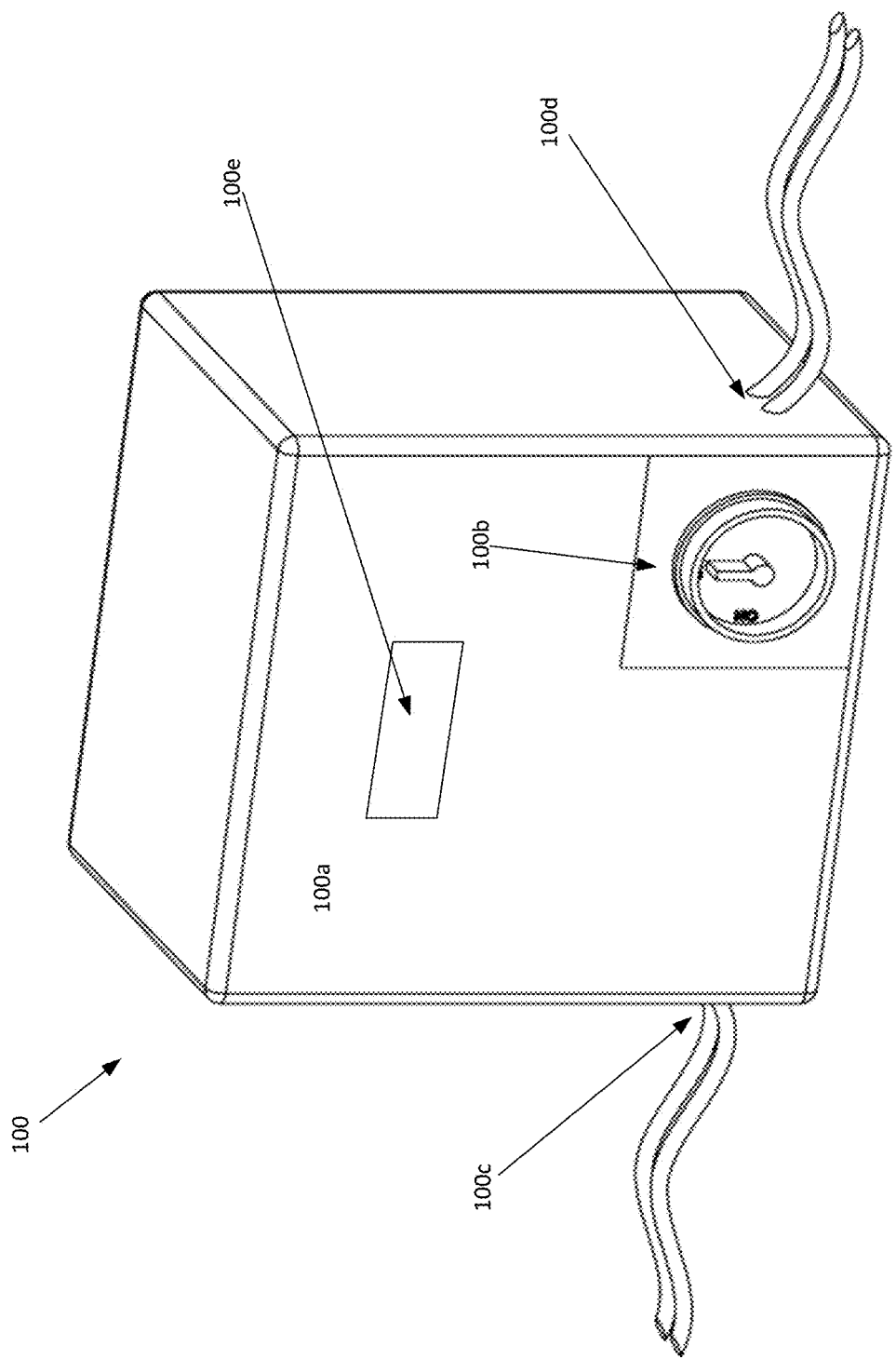

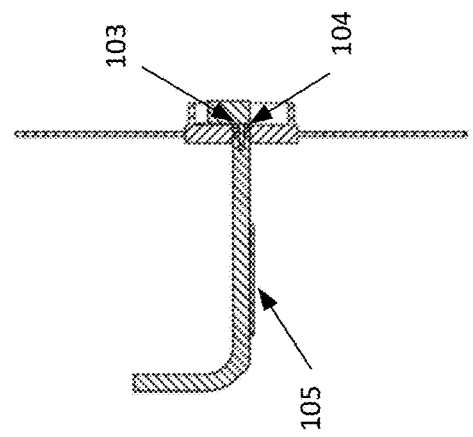
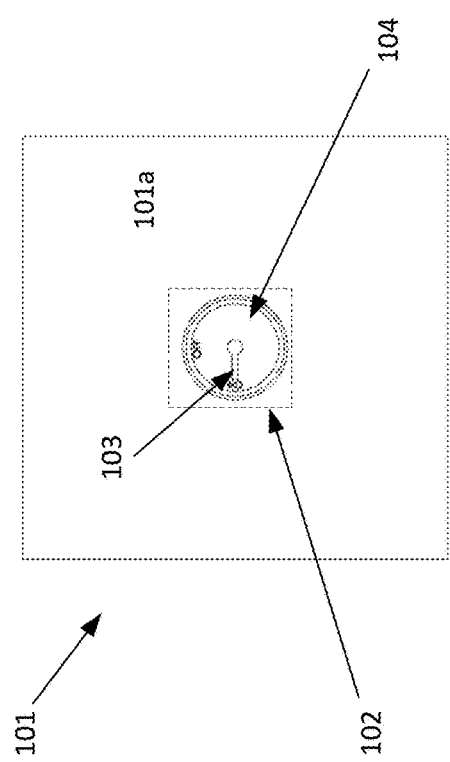
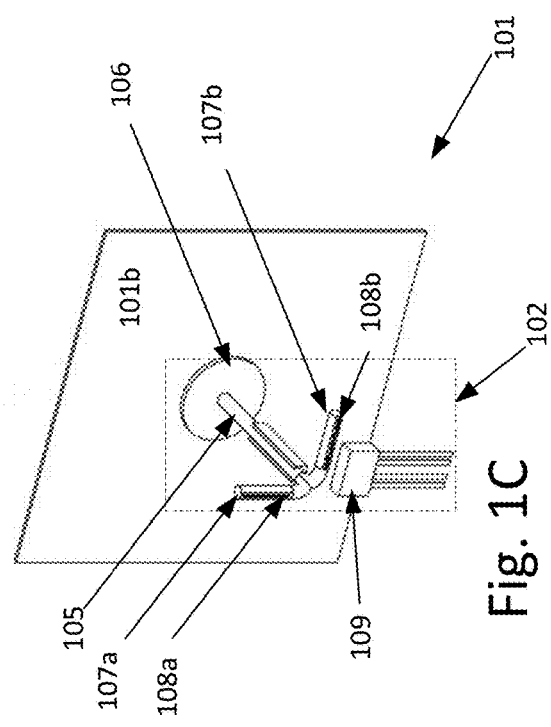

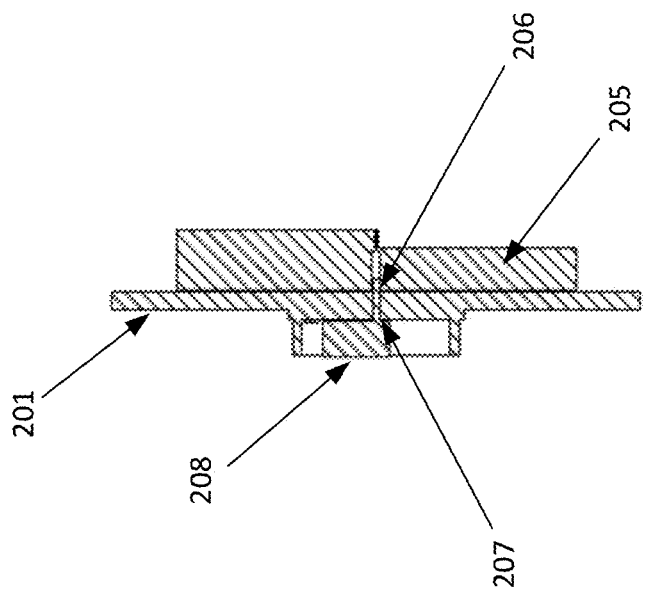
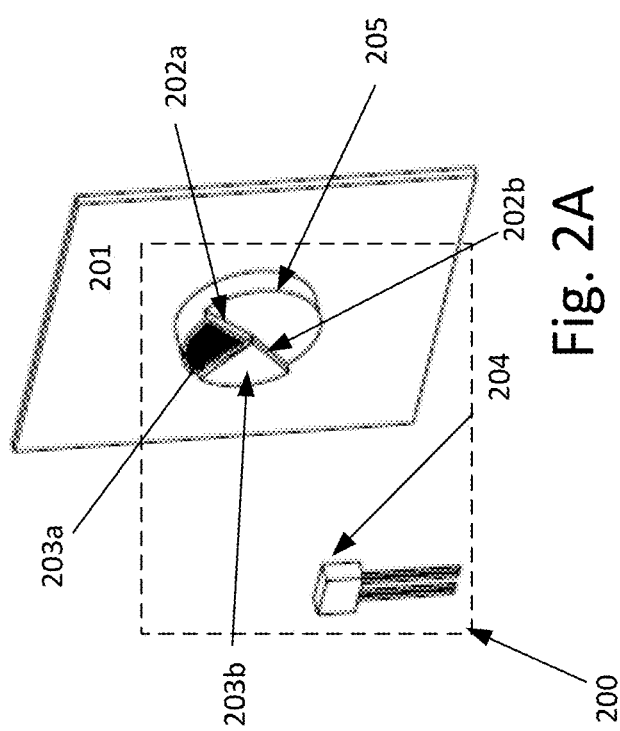

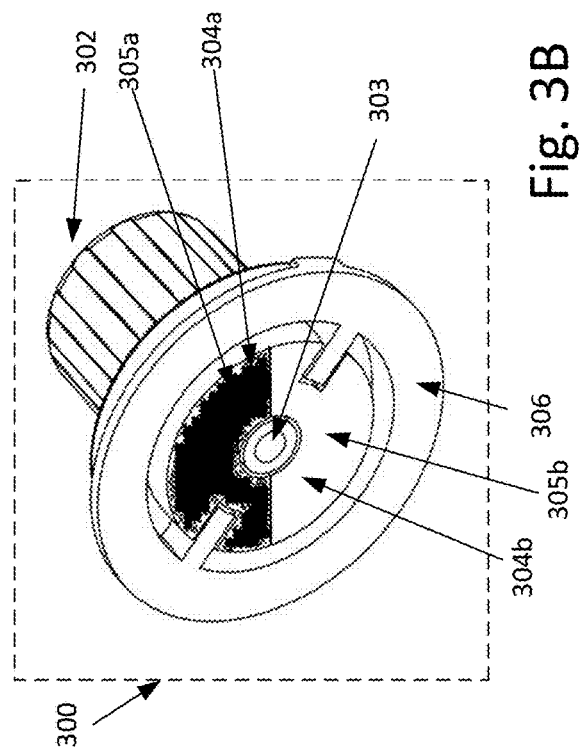
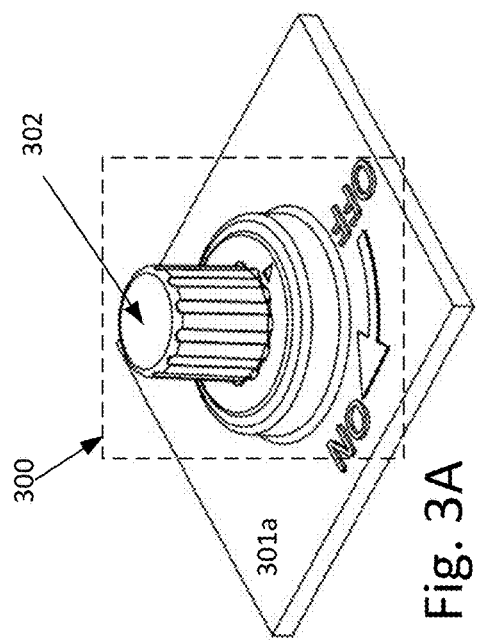
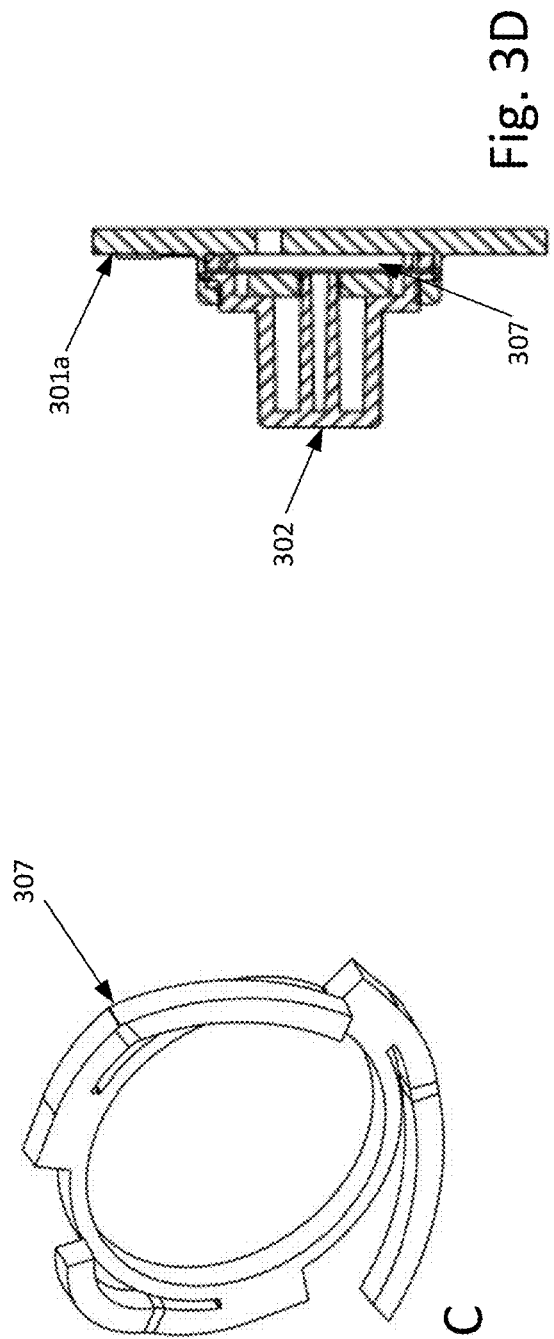

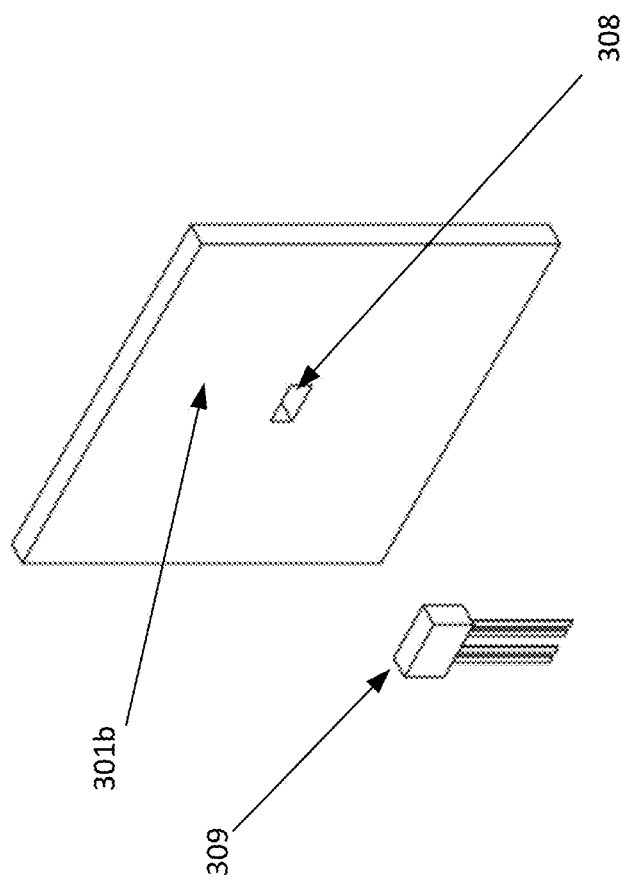

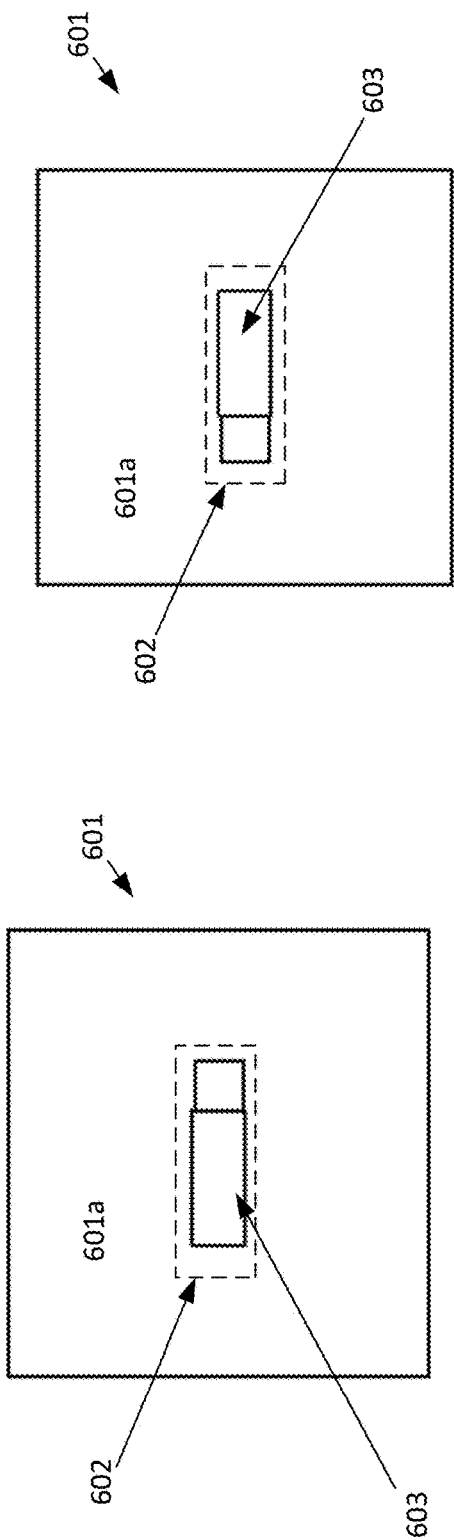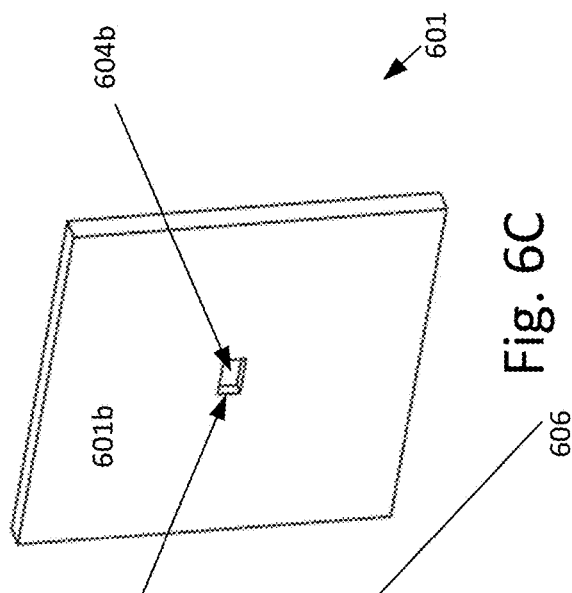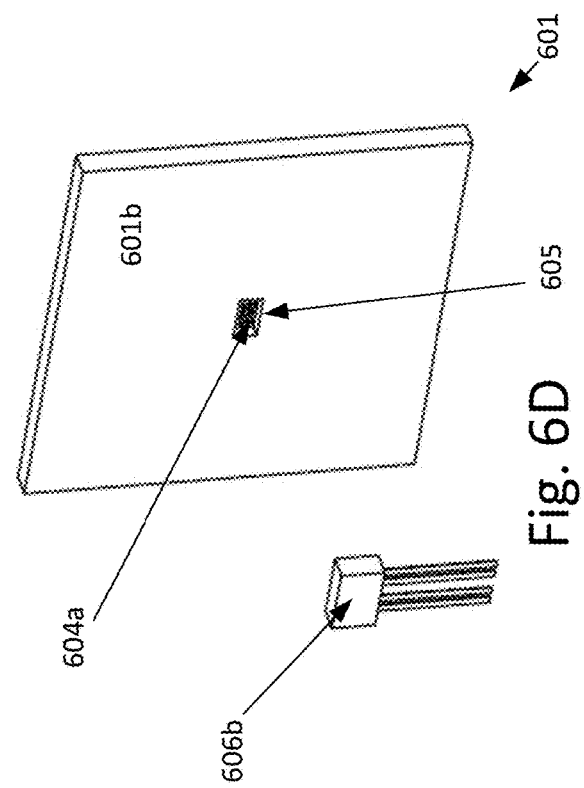
Fig. 6A  Fig. 6B  Fig. 6C  Fig. 6D

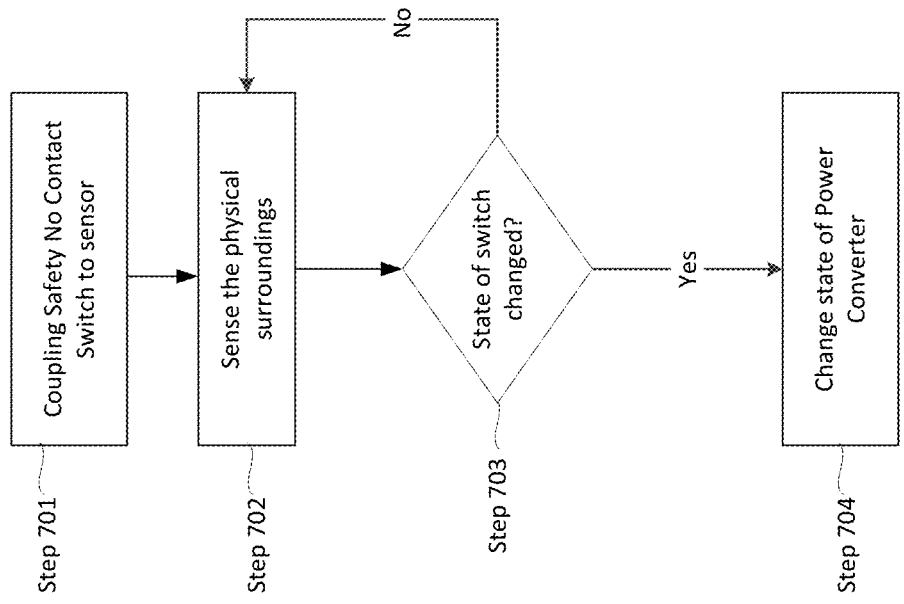

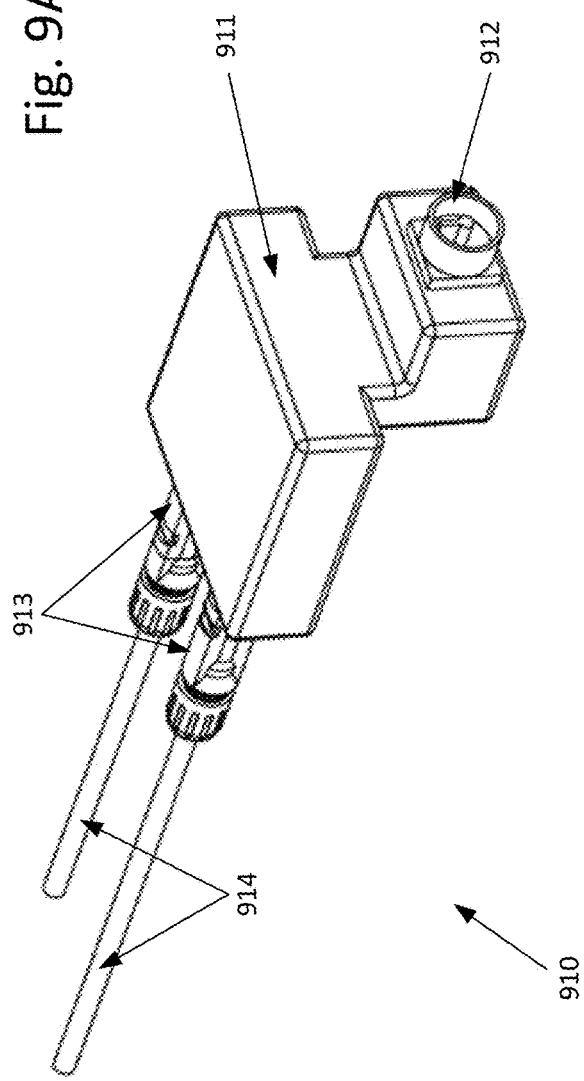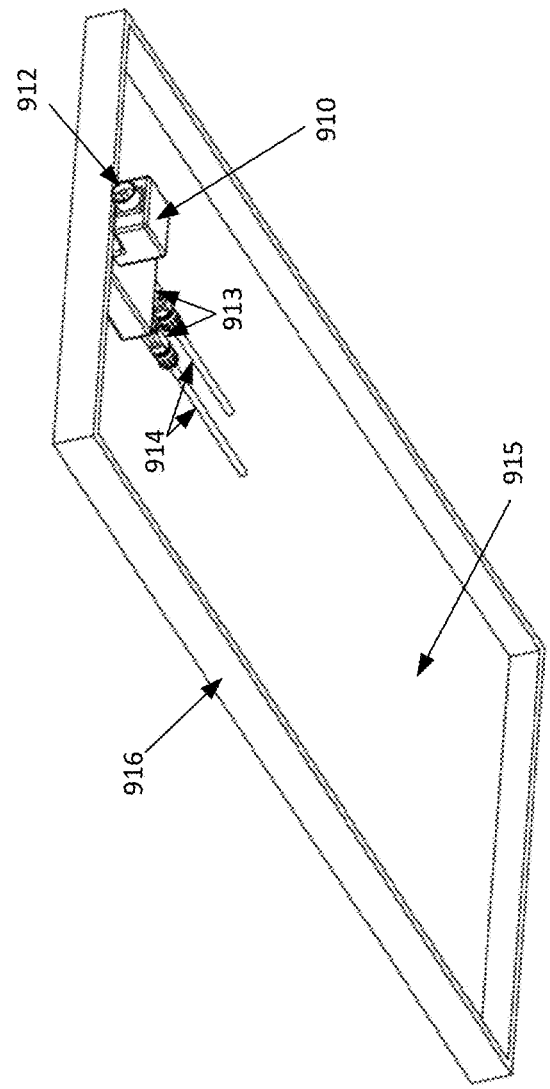

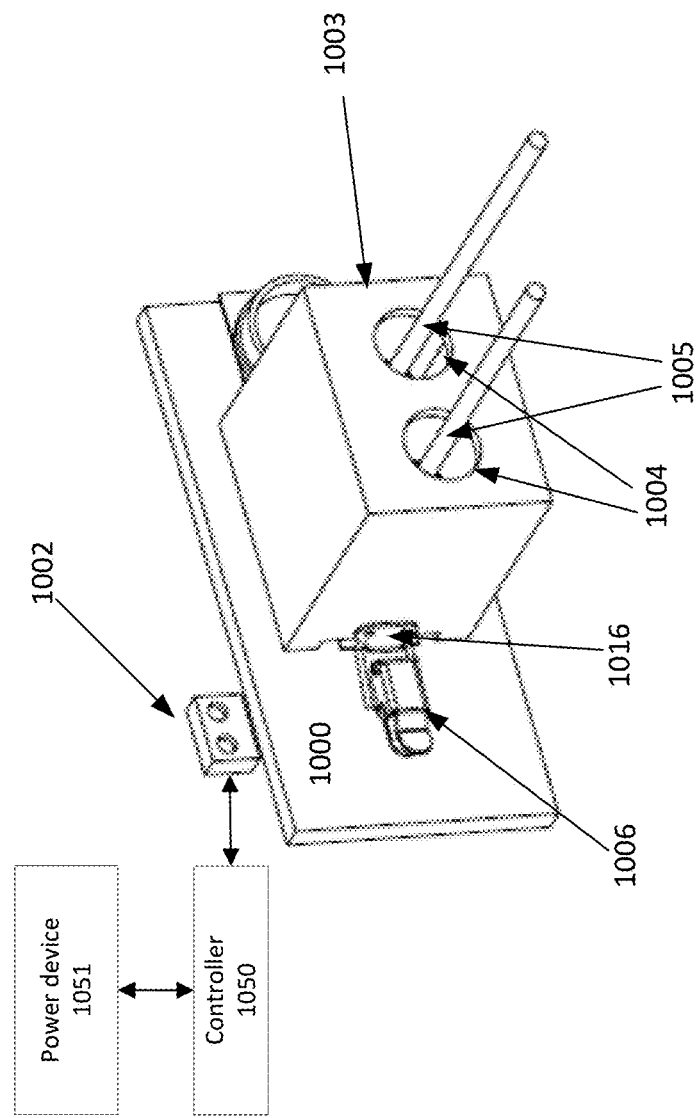

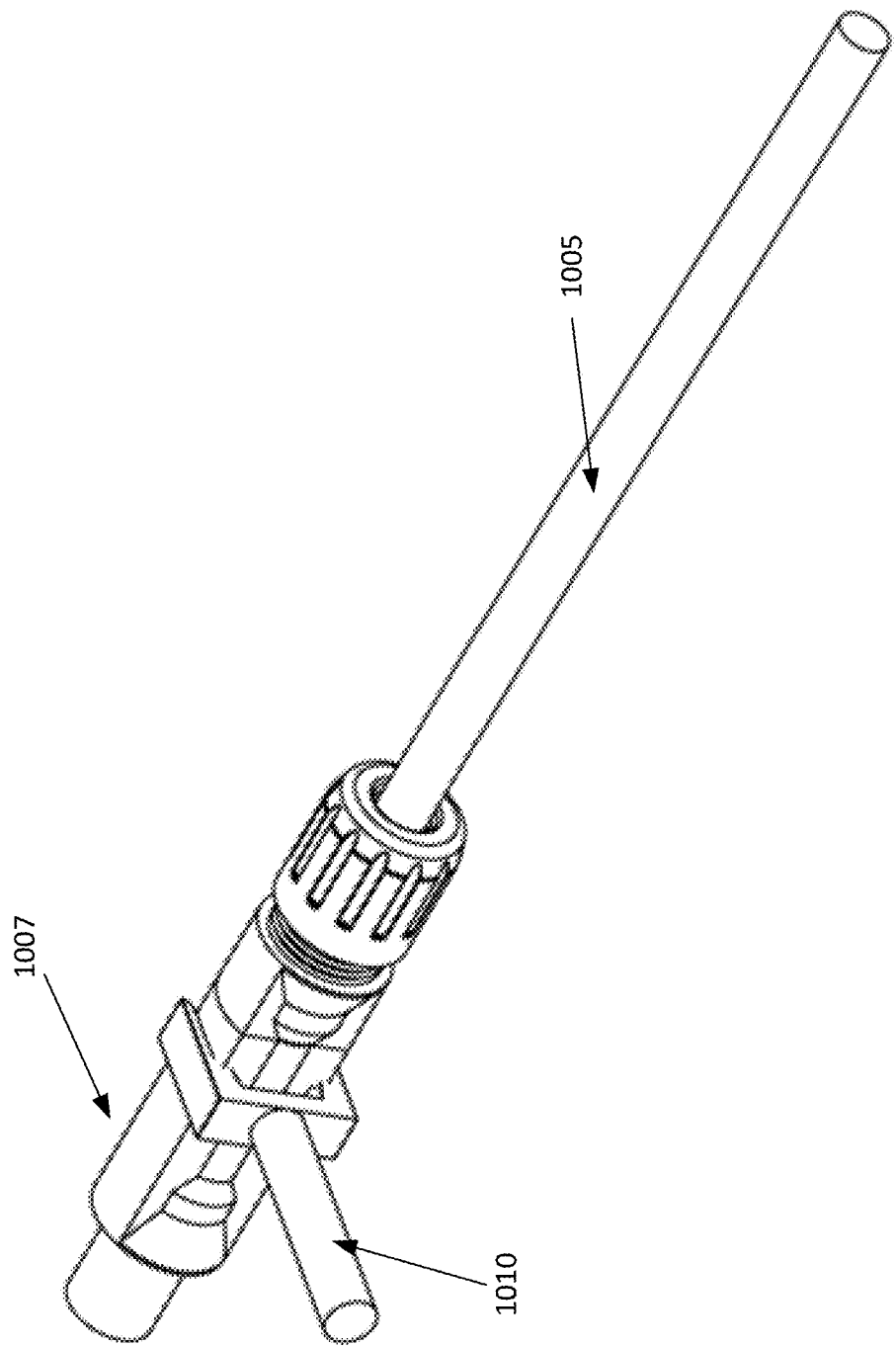

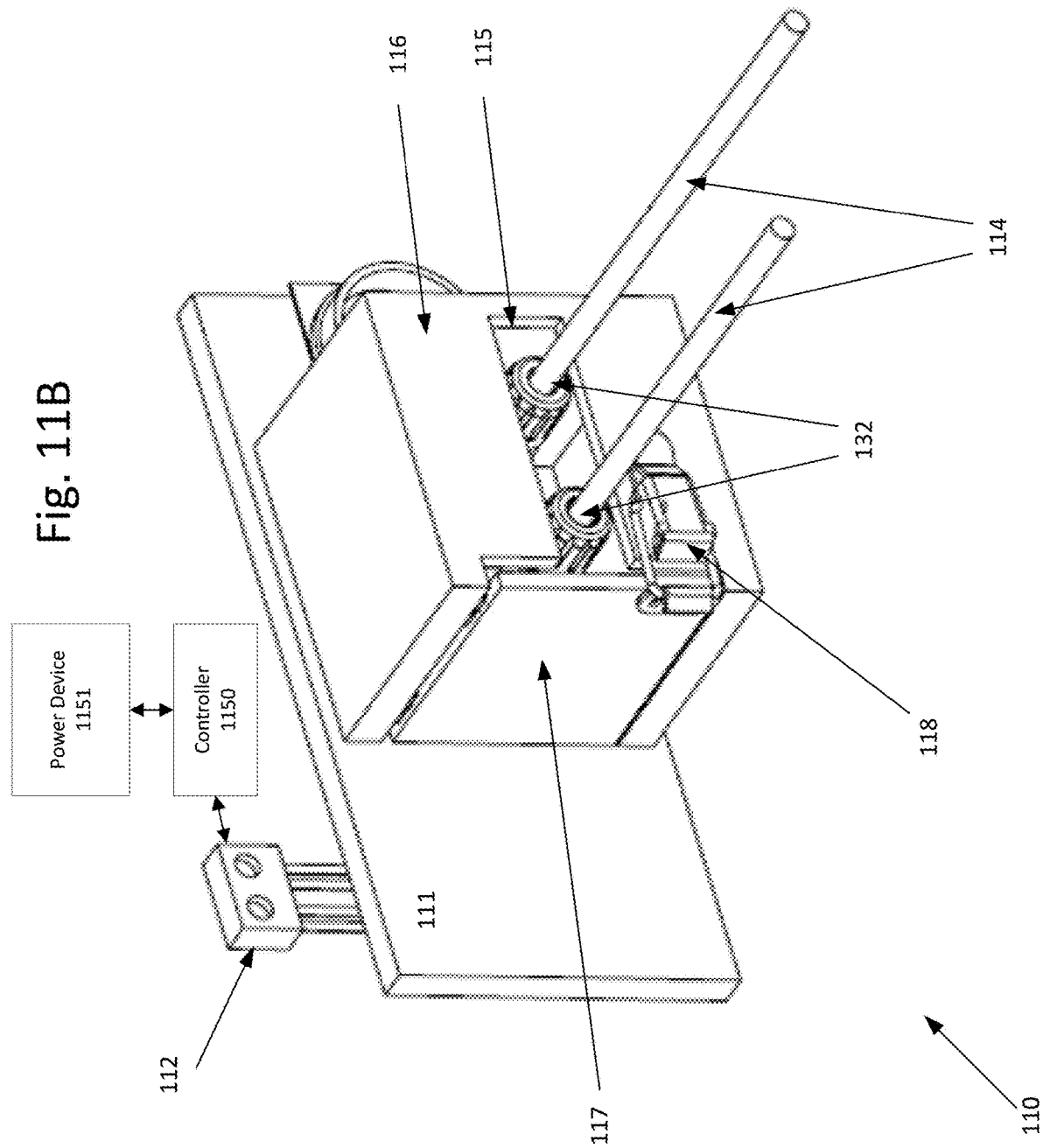

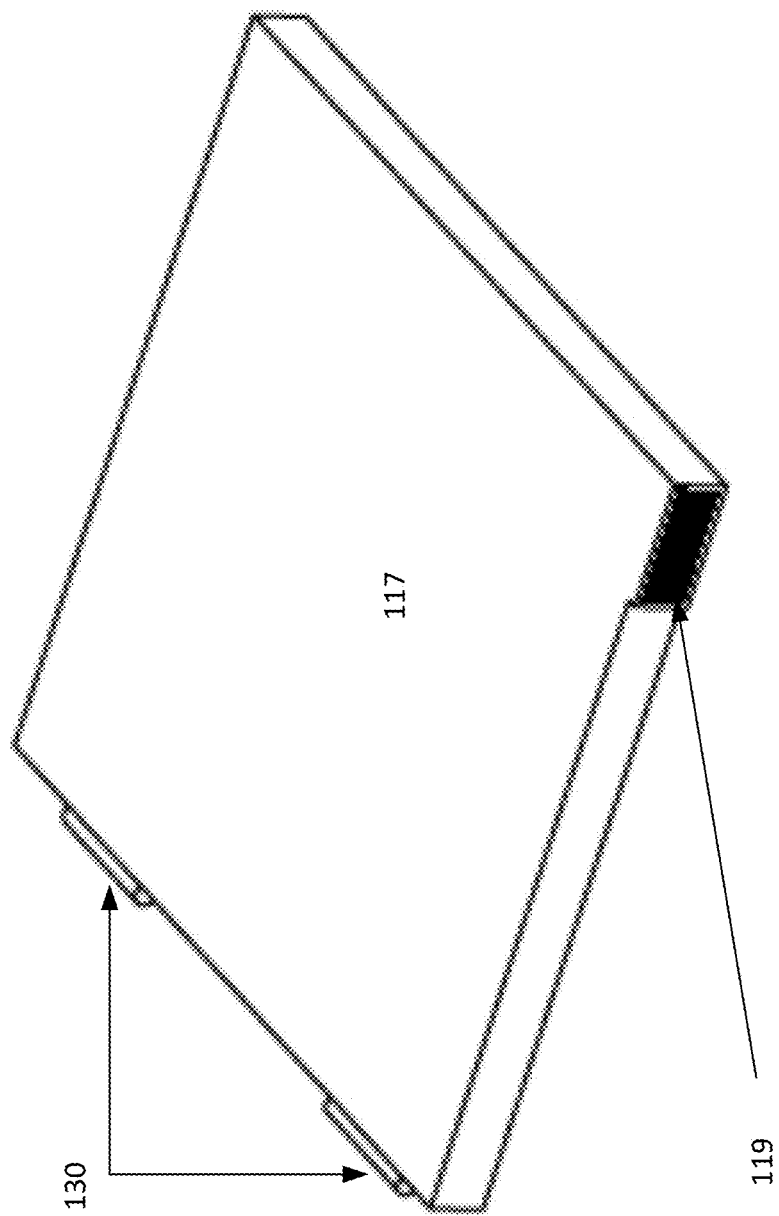

SWITCHING DEVICES FOR A POWER CONVERTER

RELATED APPLICATIONS

This application is a continuation of U.S. application Ser. No. 15/711,505, filed Sep. 21, 2017, which claims benefit to U.S. Provisional Patent Application Ser. No. 62/398,247, entitled "Hermetically-Sealed Safety No-Contact Switch," filed Sep. 22, 2016, and to U.S. Provisional Patent Application Ser. No. 62/486,550, entitled "Switch Devices for a Power Converter," filed Apr. 18, 2017, the contents of which are incorporated herein by reference in their entirety.

BACKGROUND

No-contact electronic switches are utilized in many applications, including but not limited to consumer electronics, safety systems and user-interfaces for various devices. No-contact switches may increase reliability by reducing reliance on mechanical contacts. No-contact switches may be especially useful in devices which are exposed to elements such as moisture and high temperatures, which may accelerate the erosion and/or corrosion of mechanical contacts. No-contact switches may be installed on the exterior of devices, allowing the inner components to be hermetically sealed while still responding to the switch.

The need for reliable, safe no-contact switches is particularly acute in photovoltaic (PV) systems which often feature high currents, exposed environments, residential customers, and potentially unsophisticated users. Photovoltaic power converters deployed in photovoltaic installations may remain in place for significant periods of time, such as 20-30 years. While often placed in temperature-controlled environments, there may still be humidity and other conditions which require sealing of the electronic inverter components. Furthermore, since converters may process high voltages and large amounts of power, safety and proper operation is paramount. No-contact switches controlling photovoltaic power converters may contribute to the safety of photovoltaic installations by reducing the risk of mechanical erosion and/or corrosion of inverter contacts.

SUMMARY

The following summary is a short summary of some of the inventive concepts for illustrative purposes only, and is not intended to limit or constrain the inventions and examples in the detailed description. One skilled in the art will recognize other novel combinations and features from the detailed description.

Embodiments disclosed herein may include a No-Contact Switch (NCS) for setting an operational state of an electronic device. Embodiments disclosed herein may employ a sensor for detecting movement of a mechanical element, the sensor coupled to a controller for controlling the operational state of the electronic device.

Illustrative embodiments may include use of a variety of sensors, including but not limited to InfraRed sensors, Lasers, Ultrasonic transducers, Fiber Bragg grating sensors, inductive sensors, Photodiode Proximity sensors, and may utilize a variety of ways to detect movement of a mechanical element. For example, some embodiments may include an Infra-Red (IR) sensor deployed inside a sealed enclosure, and a mechanical switch mounted on an exterior of the sealed enclosure. Moving the mechanical switch may affect the IR radiation received by the sensor, by use of various mechanical constructions disclosed herein, providing an associated controller with an indication that the mechanical element has been moved.

In some embodiments, a magnetic sensor may be deployed inside a sealed enclosure, and a mechanical switch may be mounted on the exterior of the sealed enclosure. Moving the mechanical switch may affect the magnetic field in the vicinity of the magnetic sensor, by use of various mechanical constructions disclosed herein, providing an associated controller with an indication that the mechanical element has been moved.

Mechanical elements employed in No-Contact Switches (NCSs) disclosed herein may include rotary dials, sliding-tabs, push-buttons, and the like.

No-Contact Switches disclosed herein may be applied to a wide variety of electronic devices, and may be used as two-state (e.g., ON/OFF), multi-state, or continuous-state (e.g., dimmer) switches. In particular, NCSs disclosed herein may be particularly suited for use in devices exposed to high temperatures, humidity and other weather elements for significant periods of time. For example, illustrative NCSs disclosed herein may be suitable as ON/OFF or NOT-SAFE/SAFE switches for photovoltaic DC-AC converters (i.e., inverters) which may be deployed under harsh weather conditions for a duration of time, such as 20-30 years.

Features disclosed herein may include a part of a power device enclosure, which may be movable to expose a connection between connectors mounted on the power device enclosure and connectors connected to conductors, and/or which may be configured to cause an electrical disconnection when moved. For example, a sensor may detect a change in the location of the part of the power device enclosure, the sensor providing a signal and/or measurement to a controller configured to activate a disconnect switch. This feature may, in some scenarios, provide a safety feature ensuring that the power device is turned off (or operating in a safety mode) prior to disconnecting conductors from the power device. According to some features, the removable part of the power device enclosure may activate a no-contact switch, and according to certain features, the removable part of the power device may activate a switch having mechanical contacts.

As noted above, this Summary is merely a summary of some of the features described herein and is provided to introduce a selection of concepts in a simplified form that are further described below in the Detailed Description. The Summary is not exhaustive, is not intended to identify key features or essential features of the claimed subject matter and is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures. A more complete understanding of the present disclosure and the advantages thereof may be acquired by referring to the following description in consideration of the accompanying drawings, in which like reference numbers indicate like features, and wherein:

FIG. 1A illustrates a No-Contact Switch placed on an enclosure in accordance with one or more aspects of the present disclosure FIGS. 1B-1D illustrate front, perspective and cross-sectional side views, respectively, of parts of a No-Contact Switch incorporating a rotary configuration in accordance with one or more aspects of the present disclosure.

FIGS. 2A-2B illustrate perspective views and cross-sectional side views, respectively, of parts of a No-Contact Switch incorporating a rotary configuration in accordance with one or more aspects of the present disclosure.

FIG. 3A illustrates a perspective view of an exterior of an enclosure featuring a No-Contact switch incorporating a rotary configuration in accordance with one or more aspects of the present disclosures.

FIG. 3B illustrates a perspective view of components of the No-Contact Switch of FIG. 3A.

FIG. 3C illustrates a perspective view of a safety mechanism of the No-Contact Switch of FIG. 3A FIG. 3D illustrates a perspective view of components of the No-Contact Switch of FIG. 3A.

FIG. 3E illustrates a cross sectional view of components of a safety mechanism of the No-Contact Switch of FIG. 3A.

FIGS. 6A-6B illustrate a front view of an exterior of an enclosure featuring a No-Contact Switch incorporating a sliding tab configuration, where FIG. 6A illustrates a first position of the tab and FIG. 6B illustrates a second position of the tab in accordance with one or more aspects of the present disclosures.

FIG. 6C-6D illustrate a perspective view of components of the No-Contact Switch of FIGS. 6A-6B, where FIG. 6C illustrates the first position of the tab and FIG. 6D illustrates the second position of the tab in accordance with one or more aspects of the present disclosure.

FIG. 6E illustrates a first position of the tab and FIG. 6F illustrates a second position of the tab in accordance with one or more aspects of the present disclosure.

FIG. 7 is a flow diagram of a method for using a No-Contact Switch according to one or more illustrative aspects of the disclosure.

FIG. 8A illustrates a first position of the switch and FIG. 8B illustrates a second position of the switch with one or more aspects of the present disclosure.

FIG. 9A illustrates a No-Contact Switch incorporating a rotary switch on a power converter with one or more aspects of the present disclosure.

FIG. 9B illustrates the power converter of FIG. 9A placed on a solar panel with one or more aspects of the present disclosure.

FIGS. 10A-10B illustrate perspective views of a disconnect switch mounted on an enclosure in accordance with one or more aspects of the present disclosure.

FIG. 10E illustrates a perspective view of connector tool for disconnecting a cable from a respective connector in accordance with one or more aspects of the present disclosure.

FIG. 11B illustrates a perspective view of a disconnect switch mounted on an enclosure with a locked door in accordance with one or more aspects of the present disclosure.

FIG. 11D illustrates a perspective view of a disconnect switch door in accordance with one or more aspects of the present disclosure.

DETAILED DESCRIPTION

Figure 4B:
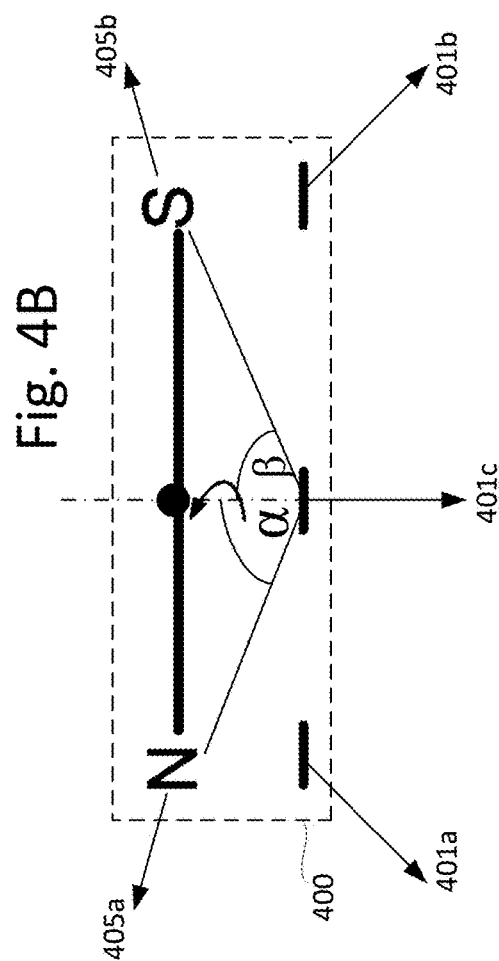
FIG. 4B is a schematic representation of a part of the No-Contact Switch of FIG. 4A.

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

Reference is now made to FIG. 1A, which shows an enclosure 100a of a power device 100 featuring a safety NCS 100b according to one or more illustrative embodiments. The power device of a photovoltaic system may include a DC-AC inverter and/or a DC-DC converter. For convenience, reference to power device 100 will be made to as a DC-AC inverter but the reference is not to be restrictive. Safety measures for a photovoltaic system, e.g., employing power device 100, may include providing a manual switch to disconnect output 100d of power device 100 from input 100c. One reason for this safety measure may be high voltage and/or current processed by power device 100. For example, the DC voltage input to a power inverter in photovoltaic systems may reach 1000 Volts, 1500 Volts, 2000 Volts or higher. Enclosure 100a may be made of plastic, metal or a similar hermetically sealed material. Safety NCS 100b may be mounted on the exterior of enclosure 100a in a certain area, for ease of access and visibility. According to features of the disclosure herein, it may also be advantageous to have safety NCS 100b positioned so that one may be able to see the switch and its status easily. For example, and as shown in FIG. 1A, switch 100b is placed near or adjacent to a corner of enclosure 100a close to output 100d of power device 100.

Another consideration made in the placement of safety NCS 100b may be the placement of the circuit board (not shown) in the interior of enclosure 100a. For example, safety NCS 100b may be closer to the circuit board such that less material and/or components may be used to assemble the entire mechanism of switch 100b. Less material and/or components may be more economical and also may prevent technical problems that may occur during the assembly and failures over time.

According to some aspects, power device 100 may be controlled by remote access, using wireless technology (e.g. WiFi, ZigBee™, and Bluetooth™) or any other remote access technology. For example, there may be a computerized user interface that may be provided on a user device (e.g. computer, smart phone or tablet) at a different location than power device 100, which may be configured to change a mode of power device 100 from a first mode to a second mode and from a second mode to a first mode, as well as show certain parameters of power device 100, components that are connected to power device 100, and/or communicate with power device 100. A first mode of power device 100 may be a safe mode and a second mode may be a potentially unsafe mode. When switch 100b is turned from a first mode to a second mode, the user interface on the computer or tablet may update its status accordingly, meaning that if switch 100b is turned to the safe mode the interface will show that there is low or no power running through power device 100 and that if switch 100b is turned to the non-safe mode the interface may show that high power is running through the power device 100. The computerized interface may also control power device 100 in a different way than switch 100b, that is turning the power OFF or ON using the computerized interface, may mean that the power from input 100c to output 100d may be converted or not but it might not include disconnecting power device 100 from the power completely. However, turning switch 100b from ON to OFF may include disconnecting power device 100 from the power completely and maybe disconnecting the remote access as well and turning switch 100b from OFF to ON may include connecting power device 100 to the power, and connecting the computerized interface to power device 100. When changing the status of power device 100 using switch 100b, the status of power device 100 on the computerized interface may update, so if switch 100b was turned OFF the computerized user interface may show that there is no connection with power device 100, or may show that the power is down without losing connection. Knowing the status of power device 100 from a distance and at any given time may also prevent failures and or accidents with regard to power device 100.

In some embodiments, power device 100 may include screen 100e which shows the status of power device 100 and/or the electrical components that are coupled to it. When turning switch 100b from one working mode to a second mode, the transition from one mode to the other might not happen immediately, and screen 100e may show the progress of the transition from one mode to the other. Reasons for the transition not being immediate from one mode to the other may be for safety reasons which may include preventing a power outage or causing a fire in one of the components that is connected to power device 100.

In some embodiments, power device 100 may include an electronic system switch that is activated according to voice recognition. The voice recognition may be programmed so only a certain voice or voices may control the system while filtering the rest of the sounds from doing anything. Using a power switch of this sort may prevent the need to come into direct contact with power device 100 leading to less of a chance of being electrocuted from the photovoltaic system. For standard safety, mechanical switch 100b may still be employed in case that the electric system switch fails.

Reference is now made to FIG. 1B, which shows an exterior portion of a power device 100 featuring a safety NCS 102 mounted on an enclosure 101a according to illustrative embodiments. Enclosure 101a may be the same as or similar to enclosure 100a depicted in FIG. 1A. Enclosure 101a may be made of plastic, metal or a similar hermetically sealed material, and may house an electronic circuit. Safety No-Contact Switch 102 may be the same or similar to safety NCS 100b. No-contact switch 102 may include a mounted platform 104 and rotary tab 103. In some embodiments, platform 104 may not be deployed, with rotary tab 103 mounted directly on enclosure 101a. Rotary tab 103 may be designed to be manually moved between two or more positions by turning. Rotary tab 103 may be connected to a rotating axis (not shown in FIG. 1B), the rotating axis penetrating enclosure 101a and connected to switch components on the interior of enclosure 101a.

Reference is now made to FIG. 1C, which shows an interior of enclosure 101b featuring a safety NCS 102 according to illustrative embodiments. Enclosure 101b may be the interior of the same enclosure as enclosure 101a of FIG. 1B. Axis 105 may be connected on the exterior of enclosure 101b to a rotary dial or a rotary tab similar to or the same as rotary tab 103 of FIG. 1B. One or more O-rings (not explicitly depicted) or similar sealing agents may be deployed around axis 105 and in contact with enclosure 101b, maintaining the hermeticity of enclosure 101b. Platform 106 may be provided for additional stability and smooth rotation of axis 105. In some embodiments, platform 106 might not be featured. Axis 105 may be connected to legs 107a and 107b. Leg 107a may be connected to, partially or fully covered by an agent that is able to be sensed, such as reflective agent 108a, and leg 107b may be connected to or partially or fully covered by reflective agent 108b. Reflective agents 108a-b may include pads, paint, plastic or rubber covers, or other agents which may be connected to legs 107a-b. Sensor 109 may be configured to sense reflective agents 108a-b. Sensor 109 may be placed in proximity to legs 107a and 107b, such that when axis 105 is turned in a first position, leg 107a is in close proximity to sensor 109, and when axis 105 is turned in a second position, as shown in FIG. 1C, leg 107b is in close proximity to sensor 109. Sensor 109 may be a radiation sensor configured to detect radiation at a specific wavelength or across a spectrum of wavelengths. In a preferred embodiment, sensor 109 may be an Infra-Red (IR) sensor, configured to detect radiation on the IR spectrum. In some embodiments, a different sensor responsive to other portions of the radiation spectrum may be used.

Sensor 109 may include a transmitting part and a receiving part facing enclosure 101b. The transmitting part may transmit a beam, which is partially reflected back in the direction of the receiving part by reflective agent 108a or reflective agent 108b, depending on the position of rotating arm 105. When rotating arm 105 is a first position, leg 107a may be in close proximity to sensor 109 and reflective agent 108a may reflect a portion of the transmitted beam back towards the receiving part of sensor 109. When rotating arm 105 is a second position, leg 107b may be in close proximity to sensor 109 and reflective agent 108b may reflect a portion of the transmitted beam back towards the receiving part of sensor 109. Reflective agents 108a and 108b may be different in some embodiments, resulting in a different beam magnitude received by the receiving part depending on the position of rotating arm 105. For example, reflective agent 108*a* may be shiny metal, and reflective agent 108*b* may be dull plastic. When rotating arm 105 is in the first position, the beam emitted by the transmitting part is reflected by the shiny metal, resulting in a relatively high magnitude measured by the receiving part. When rotating arm 105 is in the second position, the beam emitted by the transmitting part is reflected by the dull plastic, resulting in a comparatively low magnitude measured by the receiving part.

Sensor 109 may provide the measured beam magnitudes to a controller controlling an electrical circuit, with the controller configured to respond to a change in the beam magnitude measured by sensor 109.

In some embodiments, reflective agents 108*a* and 108*b* may be similar or the same, and distinguishing between the first and second positions may be achieved by placing legs 107*a* and 107*b* at different distances from sensor 109. For example, when axis 105 is in the first position, leg 107*a* may be located 3 mm away from sensor 109. When axis 105 is in the second position, reflective agent 108*b* may be located 5 mm away from sensor 109. The different distances may result in a different magnitude measured by sensor 109, depending on the axis position.

In some embodiments, sensor 109 may be a magnetic sensor, with reflective agents 108*a* and 108*b* replaced by magnets of different charges or different polarity. For example, leg 107*a* may present the positive pole of a magnet to sensor 109, and leg 107*b* may present a negative pole of a magnet to sensor 109. When axis 105 is in a first position, sensor 109 may measure a first magnetic field, and when axis 105 is in a second position, sensor 109 may measure a second magnetic field which is different from the first magnetic field. Sensor 109 may provide the measured magnetic field to a controller, which, depending on the measured magnetic field, determined the position of axis 105.

In some embodiments, the transmitting part and receiving part of sensor 109 may be split into two or more devices, one device transmitting a beam and a second device receiving a beam and providing measured beam characteristics to a controller controlling an electrical circuit.

When dealing with high voltage components as power devices in photovoltaic systems there is a safety measure which is required according to technical standards which is isolating between the high voltage system in the power device and any system that may come into contact with the user. Safety NCS as shown in FIG. 1C may add another level of safety measure by disconnecting the exterior components of the safety NCS from the interior components that are connected to areas that may be in contact with high voltages and may include a floating ground which is at a high voltage compared to earth. When disconnecting the switch from the rest of the system there may be less of a chance of being electrocuted from the electrical components in the interior of power device 100.

Reference is now made to FIG. 2A, which shows an interior of an enclosure 201 featuring a safety NCS 200 incorporating a disc configuration according to illustrative embodiments. Enclosure 201 may be the same or similar to enclosure 101*b* as mentioned in reference to FIG. 1C. Disc 205 may be connected, via an axis similar to axis 105, to a rotary dial or a rotary tab similar or the same as rotary tab 103 of FIG. 1B mounted on the exterior of enclosure 101*a*. Disc 205 may be configured to rotate around the connecting axis (105 of FIG. 1B) according to the rotary tab (103 of FIG. 1B). Areas 202*a* and 202*b* may be mounted on disc 205. In some embodiments, areas 202*a* and 202*b* may protrude from disc 205, e.g., for assembly and/or production improvements. For example, having protruded areas may simplify the positioning of the disc in proximity to a sensor 204. Another reason may be that it may be easier to add a different material than disc 205 in a different layer rather than having two different materials in the same level as the disc itself. Area 202*a* may be connected to or partially or fully covered by reflective agent 203*a*, and area 202*b* may be connected to or partially or fully covered by reflective agent 203*b*. Reflective agents 203*a-b* may include pads, plastic or rubber covers, or other agents which may be connected to areas 202*a-b*. Sensor 204 may be placed in proximity to agents 203*a* and 203*b*, such that when disc 205 is turned to a first position, sensor 204 may sense area 202*a*, and when disc 205 is turned to a second position, sensor 204 may sense area 202*b*. Sensor 204 may be the same as or similar to sensor 109 in FIG. 1C, which may be a radiation sensor configured to detect radiation at specific or across a spectrum of wavelengths. Similar to the embodiment described with regard to FIG. 1B, in a preferred embodiment, sensor 204 may be an IR sensor, configured to detect radiation on the IR spectrum. In some embodiments, a different sensor responsive to other portions of the radiation spectrum may be used.

Sensor 204 may be the same as or similar to sensor 109, and as mentioned in reference to FIG. 1C sensor 204 may comprise a transmitting part and a receiving part facing enclosure 201. The beams transmitted by sensor 204 may be partially reflected back in the direction of the receiving part of sensor 204 by reflective agent 203*a* or 203*b*, depending on the position of disc 205. When disc 205 is in a first position, area 202*a* may be positioned in proximity to sensor 204 so that reflective agent 203*a* may reflect a portion of the transmitted beams back towards the receiving part of sensor 204. When disc 205 is in a second position, area 202*b* may be positioned in proximity to sensor 204 so that reflective agent 203*b* may reflect a portion of the transmitted beams back to the receiving part of sensor 204. Reflective agents 203*a* and 203*b* may, in some embodiments, be different, resulting in a different magnitude of the reflected beams received by the receiving part of sensor 204, depending on the position of disc 205.

Sensor 204 may provide the measured magnitude of the beams to a controller controlling an electrical circuit, with the controller configured to respond to a change in the magnitude of the beams measured by the sensor.

In some embodiments, reflective agents 203*a* and 203*b* may be the same, and distinguishing between the first and the second position may be achieved by extruding areas 202*a* and 202*b* and/or reflective agents 203*a* and 203*b* to different distances with regard to disc 205. In this embodiment, the distance between reflective agent 203*a* and sensor 204, when disc 205 is in a first position is a first distance, the distance between reflective agent 203*b* and sensor 204, when disc 205 is in a second position, is a second distance, which is different from the first distance.

In some embodiments, sensor 204 may be a magnetic sensor, with reflective agents 203*a* and 203*b* replaced by magnets of different charges and or different polarity. For example, area 202*a* may present the negative pole of a magnet to sensor 204, and area 202*b* may present the positive pole of a magnet to sensor 204. When disc 205 is in a first position sensor 204 may measure a first magnetic field, and when disc 205 is in a second position, sensor 204 may measure a second magnetic field which is different from the first magnetic field. Sensor 204 may provide the measured magnetic field to a controller, which, depending on the measurement of the magnetic field, which may determine the position of disc 205.

Reference is now made to FIG. 2B, which shows a cross section view of enclosure 201*a* and a safety NCS mechanism which is mounted on enclosure 201 of FIG. 2A. FIG. 2B may be the cross section of FIG. 2A or a similar enclosure with a safety NCS mechanism mounted on the enclosure. Rotary tab 208 may be the same or similar to rotary tab 103 of FIG. 1B. Between tab 208 and enclosure 201, at point 207, one or more O-rings or similar sealing agents may be deployed. In addition to or instead of sealing agents between tab 208 and enclosure 201, at point 206, between enclosure 201 and disc 205, O-rings or similar sealing agents may be deployed maintaining the hermeticity of enclosure 201.

Reference is now made to FIG. 3A, which shows the exterior of a power device enclosure 301*a* featuring a safety NCS 300 according to illustrative embodiments. Enclosure 301*a* may be made of plastic, metal or a similar hermetically sealed material, and may house an electrical circuit (not shown). Safety NCS 300 may have a mounted dial 302 on enclosure 301*a*. Rotary dial 302 may be designed to be manually moved between two or more positions by turning.

Reference is now made to FIG. 3B, which shows a perspective view of rotary dial 302 according to illustrative embodiments. Rotary dial 302 may be mounted on enclosure 301*a* as shown in FIG. 3A. Dial 302 may be include a number of sections, such as 303, 304*a* and 304*b*. Section 303 may be a cavity which dial 302 and enclosure 301*a* are connected via an axis or bolt or any connection that may let the rotary dial turn and prevent it from disconnecting. Sections 304*a* and 304*b* may be mounted onto rotary dial 302. In some embodiments, sections 304*a* and 304*b* may protrude from dial 302. These areas may be connected to or partially or fully covered by reflective agents 305*a* and 305*b*. Reflective agents 305*a-b* may be pads, plastic, rubber covers, or other agents which may be connected to sections 304*a* and 304*b*. A sensor, which may be the same as or similar to sensor 109 of FIG. 1C or sensor 204 of FIG. 2A, may be placed opposite to reflective agents on sections 304*a-b*.

Reference is now made to FIG. 3C and FIG. 3D which shows a safety mechanism 307 to be used in conjunction with rotary dial 302 which is placed between rotary dial 306 and the exterior of enclosure 301*a*, according to illustrative embodiments. Safety mechanism 307 may be disposed between rotary dial 302 and enclosure 301*a*, preventing accidental turning of rotary dial 302 from a first position to a second position. One type of safety mechanism which is shown in 307 is a push and turn mechanism. In order to turn rotary dial 302 from a first position to a second position, while turning rotary dial 302 there also has to be a push down which allows the turning of the dial. Safety mechanism 307 of push and turn, or other safety mechanisms, may be important when the electric circuit that is housed in enclosure 301*a* has a high voltage or currant passing through it, for example in photovoltaic (PV) systems. A safety mechanism is especially important when enclosure 301*a* is placed outside and may be under severe weather conditions and may be touched by animals or other external hazards.

Reference is now made to FIG. 3E which shows an interior of a hermetically sealed enclosure 301*b* according to illustrative embodiments. Enclosure 301*b* may be the interior side of enclosure 301*a* of FIG. 3A. On enclosure 301*b*, there may be a window 308. Window 308 may be a transparent window made of glass, plastic or other transparent material, and may be sealed using glue or a different material for sealing windows. Window 308 may be positioned so that the reflective agents that are placed on sections 304*a* and 304*b* of dial 302 as shown in FIG. 3B may reflect transmitted beams back to sensor 309 which is in the interior of the enclosure 301*b*. When dial 302 or a similar rotary dial is positioned in a first position reflective agent on section 304*a* may be positioned so it covers window 308, and when dial 302 is positioned in a second position reflective agent on section 304*b* may be positioned so it covers window 308. Sensor 309 may be the same as or similar to sensor 204 and or sensor 109, meaning sensor 309 may be a radiation sensor configured to detect radiation at specific or across a spectrum of wavelengths. In a preferred embodiment, sensor 309 may be an IR sensor, configured to detect radiation on the IR spectrum. In some embodiments, a different sensor responsive to other portions of the radiation spectrum may be used. Sensor 309 may transmit beams towards window 308, the beams being reflected back in the direction of the receiving part of the sensor by reflective agent on section 304*a* or reflective agent on section 304*b*, depending on the position of dial 302. Reflective agents on sections 304*a* and 304*b* may, in some embodiments, be different, resulting in a different beam magnitude received by the receiving part of sensor 309 depending on the position of dial 302. For example, reflective agent on section 304*a* may be shiny metal, and reflective agent on section 304*b* may be dull plastic. When dial 302 is in the first position, the beam emitted by the transmitting part of sensor 309 is reflected by the shiny metal, resulting in a relatively high magnitude measured by the receiving part of sensor 309. When dial 302 is in the second position, the beam emitted by the transmitting part is reflected by the dull plastic, resulting in a comparatively low magnitude measured by the receiving part.

Figure 4A:
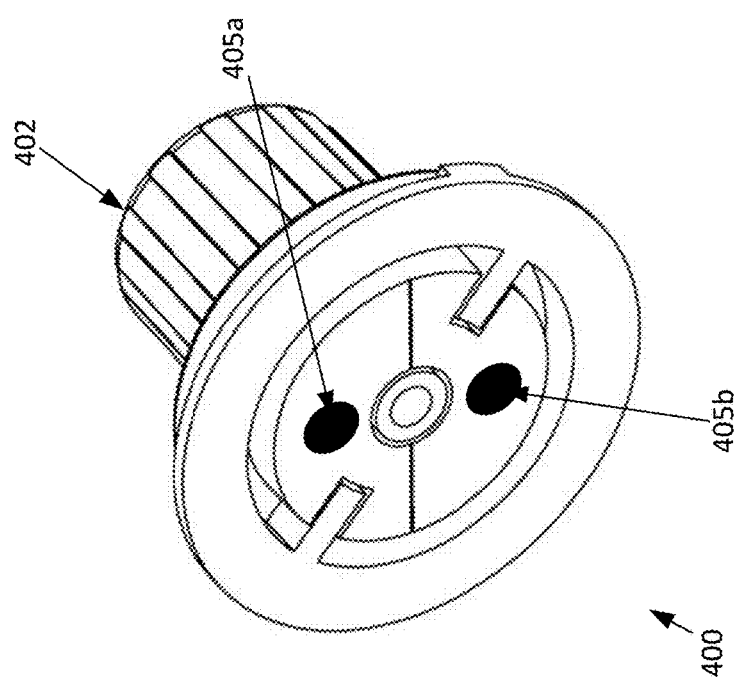
FIG. 4A illustrates a perspective view of a part of a No-Contact Switch incorporating a rotary configuration in accordance with one or more aspects of the present disclosures.

Reference is now made to FIG. 4A, which shows the side of a rotary dial 402 which is mounted on an enclosure according to illustrative embodiments. While the elements in FIG. 4A may be the same or similar as the elements in FIG. 3B, agents 405*a* and 405*b* may be different. In some embodiments, sensor 309 in FIG. 3D may be a magnetic sensor, with reflective agents 405*a-b* including magnets of different charges or different polarity. For example, agent 405*a* may present the positive pole of a magnet to sensor 309, and agent 405*b* may present a negative pole of a magnet to sensor 309. When dial 402 is in the first position sensor 309 may measure a first magnetic field, and when dial 402 is in the second position sensor 309 may measure a different magnetic field. In this case, there might not be a window in enclosure 301*b* for the purpose of sensing the change of position of dial 402.

Depending on the type of sensor used, sensor 309 may provide a signal which presents a measured value of the position of dial 402, to a controller which may determine the position of dial 402.

Reference is now made to FIG. 4B which shows a sketch of a magnetic safety No Contact Switch 400 according to illustrative embodiments. Agents 405*a-b* may be the same as agents 405*a-b* of FIG. 4A. As mentioned in reference to FIG. 4A, agents 405*a* and 405*b* may be polarized magnets. In some embodiments, there may be more than one sensor as shown in the sketch 4B. No Contact Switch 400 may include magnetic sensors 401*a*, 401*b* and 401*c*, magnet 405*a* may be polarized with a positive pole, and magnet 405*b* may be polarized with a negative pole. The configuration of switch 400 in relation to the sensors may be so that in a first position the distance between magnet 405*a* and sensor 401*a* and magnet 405b and sensor 401b will be equal while the difference in angle between magnets 405a and 405b and sensor 401c may be symmetrical relative to the center of switch 400. For example, in a first position of switch 400, the angle between sensor 401c and magnet 405a is $\alpha$, and the angle between magnet 405b and sensor 401c is $\beta$ and relative to the center $|\alpha|=|\beta|$. In this scenario the magnetic field that sensor 401c senses is the same in magnitude whether the switch is in its first position or its second position. This configuration of sensors and magnets may also solve a problem which may occur when the NCS comes into contact with an external magnet or magnetic field. An external magnet may cause a change in the magnetic field that sensors 401a and 401b sense which may cause the controller to change the state of the power circuit assuming that the switch was turned, while in fact the switch has not moved. In the case that the switch is turned, the magnetic field around sensor 401c may change less than a certain threshold because of the symmetry of magnets 405a and 405b relative to sensor 401c. But if there is an external magnet or magnetic field that may interfere with the system, sensor 401c may sense a change in the magnetic field. When the controller gets a change in output from sensor 401c that may be a sign that the change is from an external object and not because the switch's position was changed, and the controller will ignore the change.

Figure 5A:
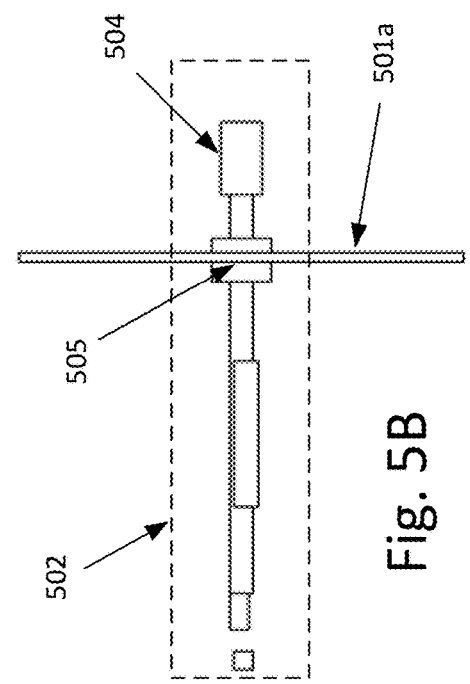
FIGS. 5A-5C illustrate front, side, and front perspective views, respectively, of parts of a No-Contact Switch incorporating a push button configuration in accordance with one or more aspects of the present disclosure.

Reference is now made to FIG. 5A which shows the exterior of an enclosure 501a featuring a safety no-contact switch 502 according to illustrative embodiments. Enclosure 501a may be the same or similar as the enclosures 101a or 301a of FIG. 1B and FIG. 3A, enclosure 501 may be made of a hermetically sealed material and may house a power device (not shown). Safety NCS 502 may include mounting platform 503 and a push button 504. Push button 504 may be designed to be manually moved between two or more positions by pushing. Push button 504 may be connected to an axis which penetrates enclosure 501a, or it itself may be the axis that penetrates the enclosure. Another embodiment of the push button safety NCS 502 may include a push button that penetrates enclosure 501 and moves a different axis that is placed in the interior of the enclosure.

Figure 5C:
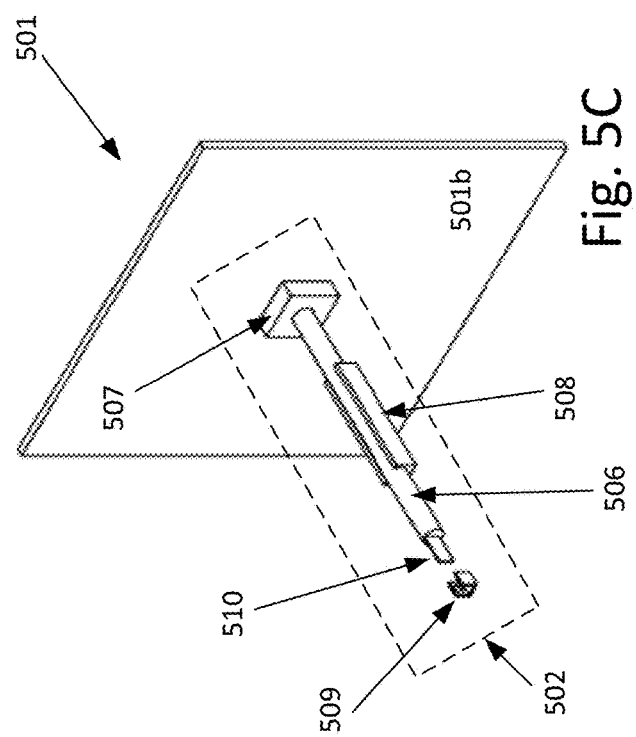
Figure 5B:
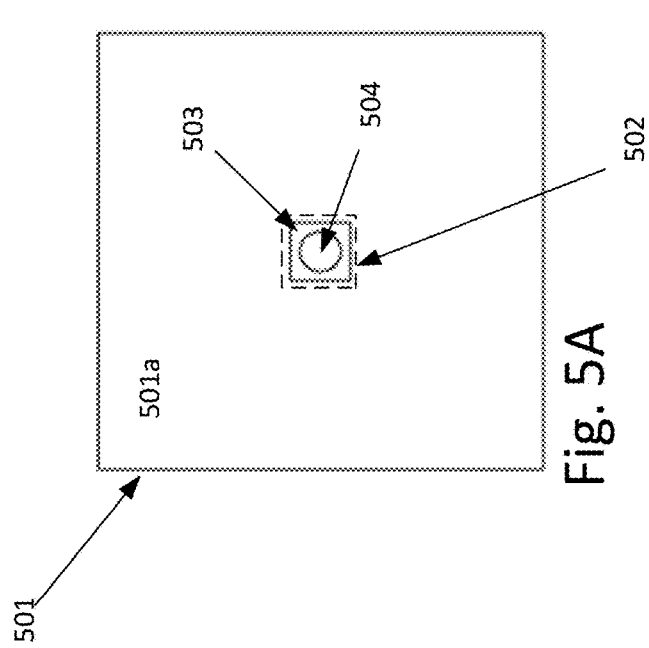

Reference is now made to FIG. 5B which shows a side view of a safety NCS 502 configured to be activated by push button 504 according to illustrative embodiments. In order to maintain the hermeticity of enclosure 501a, O-rings (not shown) or similar sealing agents may be deployed around point 505, which may be the penetrating point of the enclosure and in contact with the enclosure.

Reference is now made to FIG. 5C which shows the interior of an enclosure 501 featuring safety NCS 502 which is activated by a push button according to illustrative embodiments. Enclosure 501b may be an interior of enclosure 501 of FIG. 5A. Connecting arm 506 may be connected on exterior 501a of enclosure 501 to a push button similar or the same as push button 504 of FIG. 5A. Platform 507 may be preferably provided for additional stability and smooth linear movement of connecting arm 506, and track 508 may also provide additional stability and the prevention of displacement that is not in the direction of the axis. In some embodiments, platform 507 and/or track 508 might not be featured. Tip 510 may be pointed, smaller and/or a different shape than connecting arm 506 according to various embodiments. For example, sizing and dimensioning of tip 510 relative to connecting arm 506 may allow for tip 510 to fit into a space of sensor 509. When connecting arm 506 is in the first position of the switch, tip 510 may partially or fully block one side of the sensor from the other side, and when connecting arm 506 is in the second position of the switch, tip 510 might not block any or partially one side of the sensor from the second side. Sensor 509 may be a radiation sensor, and in certain embodiments, may be an IR sensor. The difference between sensor 509 and sensor 109 of FIG. 1C may be the configuration of the sensor. For example, sensor 509 may be a radiation sensor, in which the receiver part is side by side with the transmitter part. In such examples, an external object may reflect the transmitted beams back to the receiver part. In another example, sensor 509 may be a radiation sensor, in which the receiver part is across from the transmitter part. In such examples, the receiver part may receive directly from the transmitter, unless there is an external object which is blocking one part from the other. In FIG. 5C, the configuration of sensor 509 may be of the second type, meaning that the transmitter and receiver are across from each other. For example, the configuration of the switch may be as follows. In a first position, there may be no external object in the space between the transmitter and the receiver, which allows the receiver to receive the transmitted beams from the transmitter. In a second position of the switch, tip 510 may be in the space between the transmitter and the receiver preventing part of or all of the beams from reaching the receiver of sensor 509.

Figure 5D:
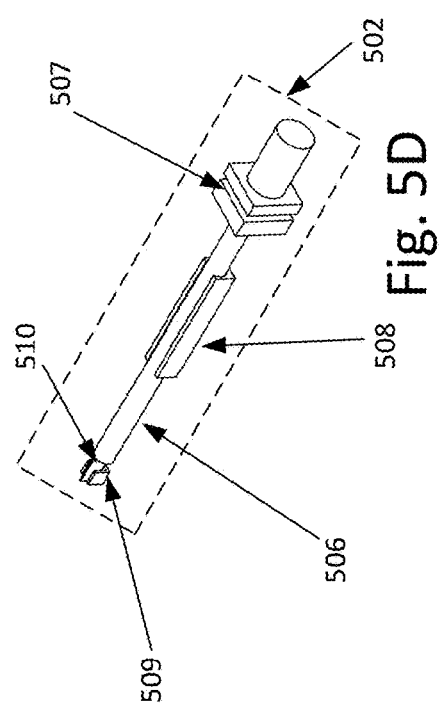
FIG. 5D illustrates a perspective view of components of the No-Contact Switch of FIGS. 5A-5C.

Reference is now made to FIG. 5D which shows an illustrative embodiment of the second position of NCS 502 and tip 510 of FIGS. 5A and 5C. As mentioned above tip 510 may prevent the beams transmitted from the transmitter of sensor 509 from reaching the receiver of sensor 509. In some embodiments, tip 510 may be made of a transparent or partially transparent material and therefore might not prevent the beams from one side of sensor 509 to the other but rather change the power and/or the amplitude of the beams that are sensed by the receiver part depending on the material that tip 510 is made of.

In some embodiments, sensor 509 may be a magnetic sensor, with tip 510 having a magnet mounted thereon. When connecting arm 506 is in a first position, the magnet may be a certain distance from the sensor causing the magnetic field around the sensor to be of a certain strength. When connecting arm 506 is in a second position, the magnet is at a different distance from the sensor causing the magnetic field around the sensor to change. Sensor 509 may provide the measured magnetic field to a controller, which, depending on the measured magnetic field, may determine the position of connecting arm 506 and the position of the switch.

Reference is now made to FIG. 6A and FIG. 6B which show the exterior of an exterior 601a of an enclosure 601 featuring a safety NCS 602 which is activated by a sliding tab according to illustrative embodiments. Enclosure 601 may be the same or similar to enclosure 101 of FIG. 1A. Enclosure 601 may be made of a hermetically sealed material, and may house an electronic circuit. Safety NCS 602 may include a mounted sliding tab 603 on the exterior of enclosure 601a. Sliding tab 603 may be designed to be manually moved between two or more positions by sliding. In FIG. 6A, sliding tab 603 is in a first position and, in FIG. 6B, sliding tab 603 is in a second position.

Reference is now made to FIG. 6C and FIG. 6D which show an interior portion of an enclosure 601b featuring a safety NCS according to illustrative embodiments. Enclosure 601b may be the same or similar as enclosure 601a of FIGS. 6A-6B. Under sliding tab 603 is window 605 which is a transparent window which may be hermetically sealed using glue or other hermeticity materials for windows. For each position of tab 603, a different part of tab 603 may be against the window. In the first position of tab 603, as shown in FIG. 6A, reflecting agent 604a may be against window 605 and in the second position of tab 603, as shown in FIG. 6A, agent 604b may be against window 605. Reflective agents 604a and 604b may include pads, paint, plastic, rubber covers or other agents which may be connected to tab 603. Sensor 606b may be placed in proximity to window 605, e.g., in a similar fashion to sensor 309 in FIG. 3D, so that when tab 603 is in the first position, reflecting agent 604a may reflect back to sensor 606b, and when tab 603 is in a second position reflecting agent 604b may reflect back to sensor 606b. Sensor 606b may be a radiation sensor, preferably an IR sensor, and may comprise of a transmitting part and a receiving part. The transmitting part may transmit beams through window 605, and reflect back off a reflecting agent back to the receiver part of sensor 606b. Each reflective agent may reflect a different proportion of the beams back to the receiver part of the sensor. In some embodiments reflecting agents 604a and 604b may be different, resulting in a different beam magnitude received by the receiving part depending on the position of sliding tab 603. Sensor 606b may provide the measured beam magnitudes to a controller controlling an electrical circuit, with the controller configured to respond to a significant change in the beam magnitude measured by sensor 606.

Figure 6E:
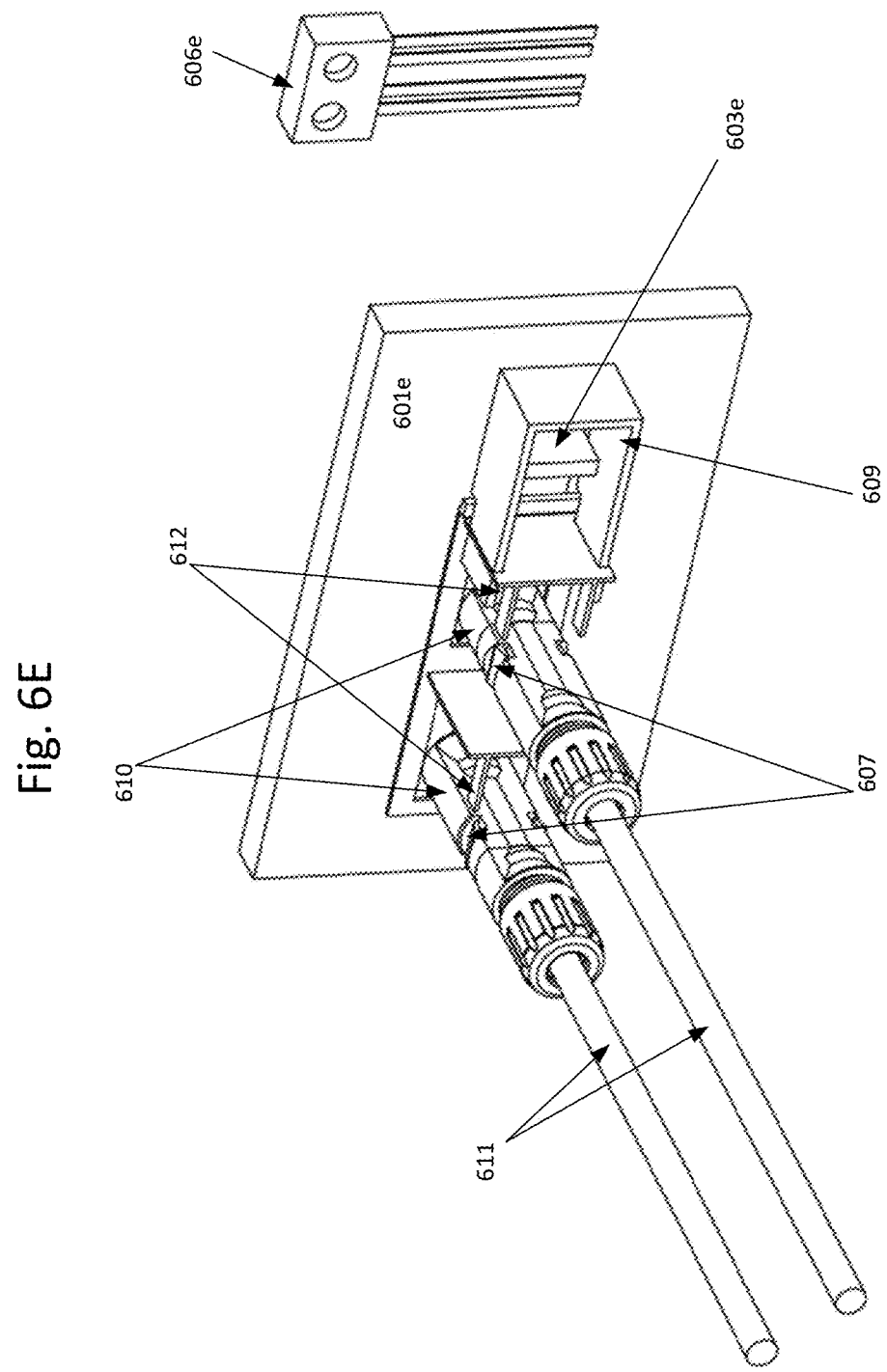
FIG. 6E-6F illustrate a perspective view of components of a No-Contact Switch incorporating a sliding tab configuration and a safety cable lock, where
Figure 6F:
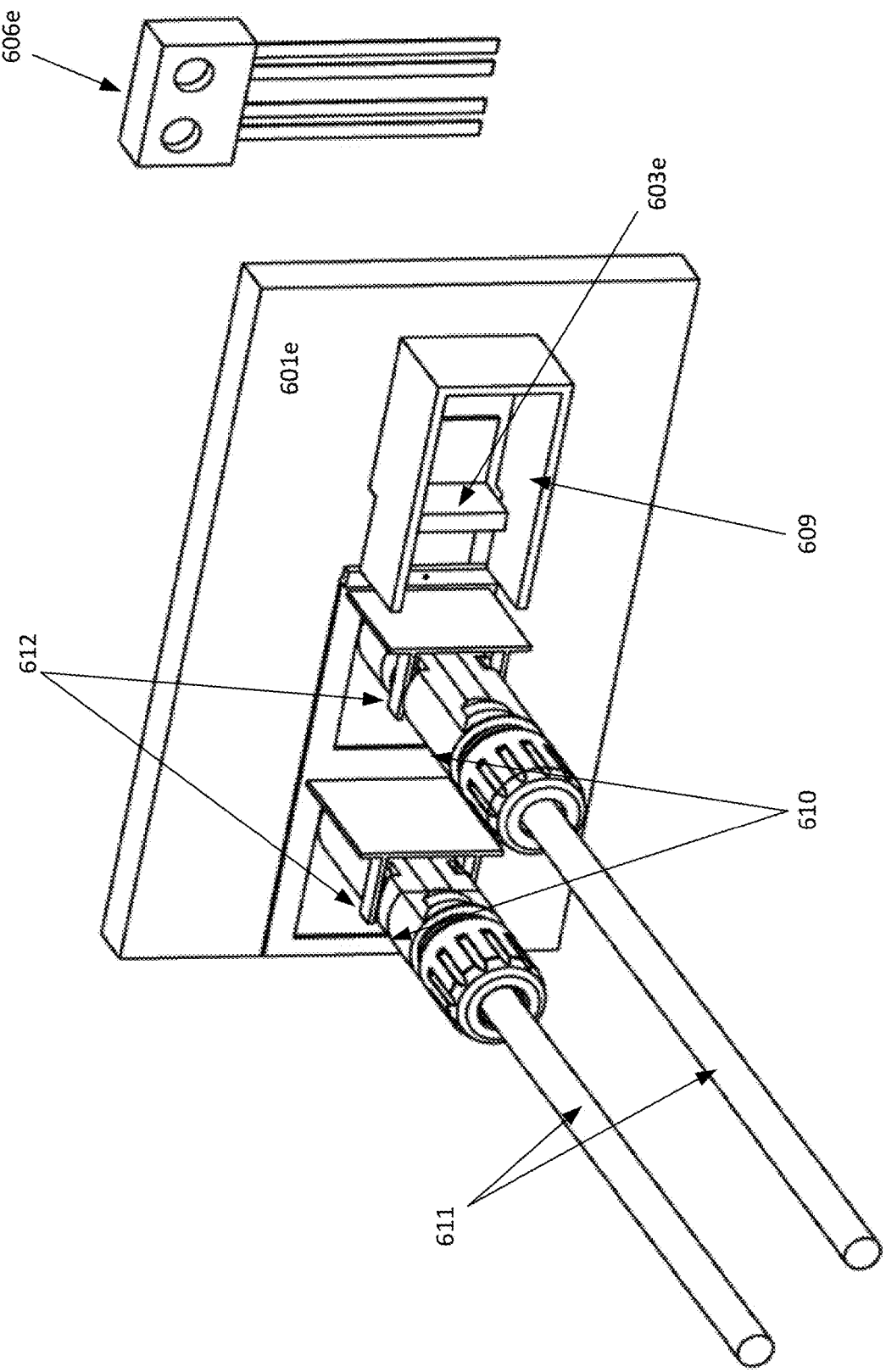

Reference is now made to FIGS. 6E and 6F which show the exterior of an enclosure featuring a safety NCS which is activated by a sliding tab. FIG. 6E shows a first position of the tab and FIG. 6F shows a second position of the tab, according to illustrative embodiments. Enclosure 601e, sliding tab 603e and sensor 606e may be the same or similar to enclosure 601a, tab 603 and sensor 606b, respectively, of FIG. 6A. Safety NCS may also include barrier 609 which may prevent sliding tab 603e by mistake and/or to keep external objects from moving the switch from a first position to a second position. Barrier 609 may be mounted on enclosure 601e positioned so tab 603e may move from a first position to a second position. As mentioned with reference to FIG. 1A, in some embodiments, the safety NCS may be positioned on enclosure 601e for ease of visibility and operation.

According to some aspects, safety NCS may include external cable lock 612. Cable lock 612 may be connected or even made of one piece as tab 603e. The movement of tab 603e and the movement of lock 612 may both be linear making it possible to be one piece. When tab 603e is in a first position as shown in FIG. 6F, lock 612 may partially or fully cover click tabs 607 which lock cables 611 to connectors 610, and when tab 603e is in a second position as shown in FIG. 6E, lock 612 may fully or partially reveal click tabs 607. Covering click tabs 607 may prevent unplugging cables 611 from enclosure 601e and connectors 610, and when click tabs 607 are revealed it may be possible to release click tabs 607 and unplug cables 611 from connectors 610 and enclosure 601e. Cable lock 612 may be mounted on a track in order to keep the lock positioned and keep its movement linear.

Reference is now made to FIG. 7 which shows a flow diagram of a Safety No-Contact Switch according to one or more illustrative aspects of the disclosure. At step 701, a sensor may be coupled to a switch which may include a rotary dial, a sliding tab, a push button, or the like. According to the kind of sensor and the kind of switch used to trigger the sensor, a setup that is suitable for the elements above may be applied. The sensor may be configured to sense the physical surroundings including the position of the switch. At step 702, the sensor may be set to sense and measure the state and position of the switch. For example, if the sensor is of an IR type, and the transmitter receive a signal at a specified current or current range and is under a specified voltage or voltage range, the sensor may emit IR beams at a certain angle range. If the receiver receives a specified current or a current range and is under a specified voltage or voltage range the sensor may detect the reflecting beams which reach its receiver. The strength and power of the beams that are received by the receiver may be measured. At step 703, the measurement that is output from the sensor is read by a controller to determine if a state of the switch has changed. For example, if the output signal has not changed more than a set threshold the sensing of the physical may continue by returning to step 702. If the output signal has changed more than the set threshold, depending on the position and configuration of the switch, a change signal may be sent by the controller to the power circuit to change a state of power device, step 704. For example, if the switch has two positions, ON and OFF, if the current state of the power circuit is OFF and the switch is in the OFF position, the sensor may read the power and magnitude of the IR beams which are received by the sensor. If the output signal indicates the switch has not changed instructions will not be sent to change the status of the power circuit. When the switch is switched from OFF to ON, a physical position of the switch may be changed, which may cause the sensor to receive IR beams of a different power and/or magnitude. The resulting difference in the output signal may cause the activation of the power circuit. In some embodiments, the controller may change the state of the power circuit according the signals sent by the sensor without analyzing the signal from the sensor if it sent an OFF signal or an ON signal, but rather if there was a change and if a change was sensed the controller may send a signal to the power circuit different than the current state of the power circuit.

Figure 8A:
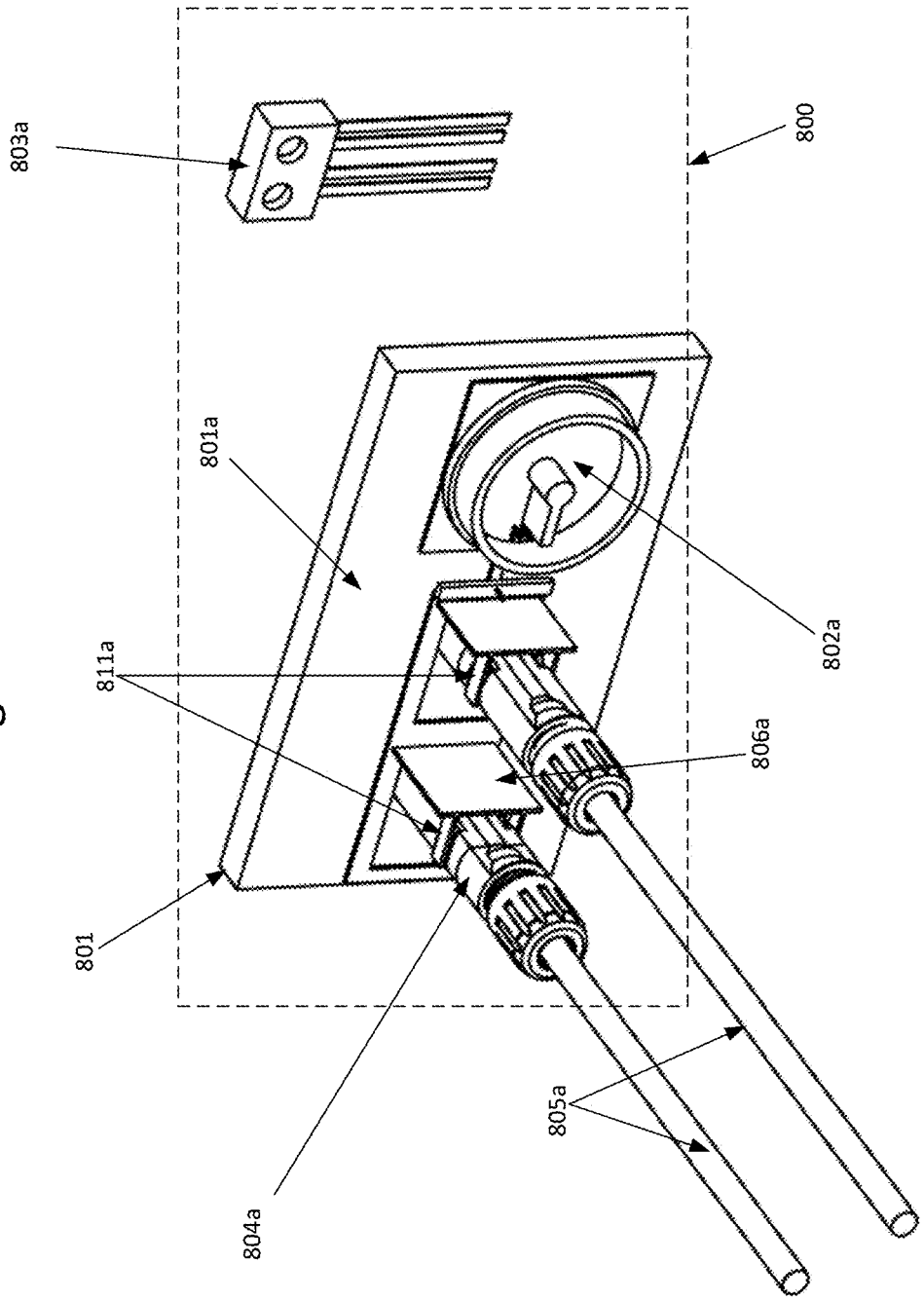
FIGS. 8A-8B illustrate perspective views of parts of a No-Contact Switch incorporating a rotary configuration and a safety cable lock, where

Reference is now made to FIG. 8A, which shows the exterior 801a of an enclosure 801 featuring a safety NCS 800 which is activated by a rotary tab according to illustrative embodiments. Enclosure 801 may be the same or similar to enclosure 101, and it may house a power converter or a different electrical circuit (not shown). Safety NCS 800 may include mounting switch 802a on the exterior of enclosure 801a. Switch 802a may include a tab or a knob or a different protruding part for gripping and turning the switch from one position to a second position. Switch 802a may be placed in proximity to power cables 805a, and connectors 804a of cables 805a, to enclosure 801a. Connectors 804a may connect to enclosure 801a without penetrating the enclosure, and using a certain mechanism have the electricity penetrate enclosure 801. An example of such a mechanism may be, producing enclosure 801 with conductive points and on these points mount connectors 804a, creating a way to have electricity connect without damaging the hermeticity of the enclosure. Safety NCS 800, as mentioned in reference to previous figures, may comprise configuring the movement of switch 802a to sensor 803a which is placed in the interior of enclosure 801.

According to some aspects, safety NCS 800 may also include locking electric cables 805a and connectors 804a using lock 806a. Connectors 804a and cables 805a may include a click lock mechanism which keeps the connectors connected. When cables 805a are connected to connectors 804a and enclosure 801a the connectors are clicked in, and in order to release them the tabs that clicked in need to be pushed down while pulling the cables away of enclosure 801a. A tool may be used in order to release cables 805a from connectors 804a. For safety matters, there may be a desire to lock electric cables 805a to connectors 804a while it may be dangerous to unplug them. For example, if enclosure 801a is a power converter in a photovoltaic system the DC voltage in the converter may be as high as 1000 volts, in order to prevent someone from disconnecting cables 805a while the voltage is that high and may be fatal, the tabs of the click lock may be covered in a way that may prevent unlocking cables 805a from connectors 804a, using lock 806a. Lock 806a may include a mounted side on enclosure 801a or a track which is mounted on enclosure 801a in the direction of the movement of lock 806a. Lock 806a may include two openings for connectors 804a. Cables 805a may be a male and a female causing the click tabs to be at different distances from enclosure 801a, in order to cover the click tabs on a second side of lock 806a there may be two protruded sections, one for each tab cover 811a. The tab covers 811a of tabs 807a at lock 806a may protrude from the extruded sections from the base of the lock as shown in FIG. 8A, so that when switch 802a moves from a first position to a second position, lock 806a may cover the click tabs and when switch 802a moves from a second position to a first position, lock 806a may reveal the click tabs. For example, when switch 802a is switched to a non-safe mode, lock 806a may partially or fully cover the tabs of the click lock of connectors 804a and cables 805a preventing the access of the unlock mechanism that comes with the click lock. And when switch 802a is switched to a safe mode, lock 806a may fully or partially uncover the tabs of the click lock of cables 805a and connectors 804a giving access to the unlock mechanism. Lock 806a may include a cover for each click tab or a cover for only a number of tabs.

Figure 8B:
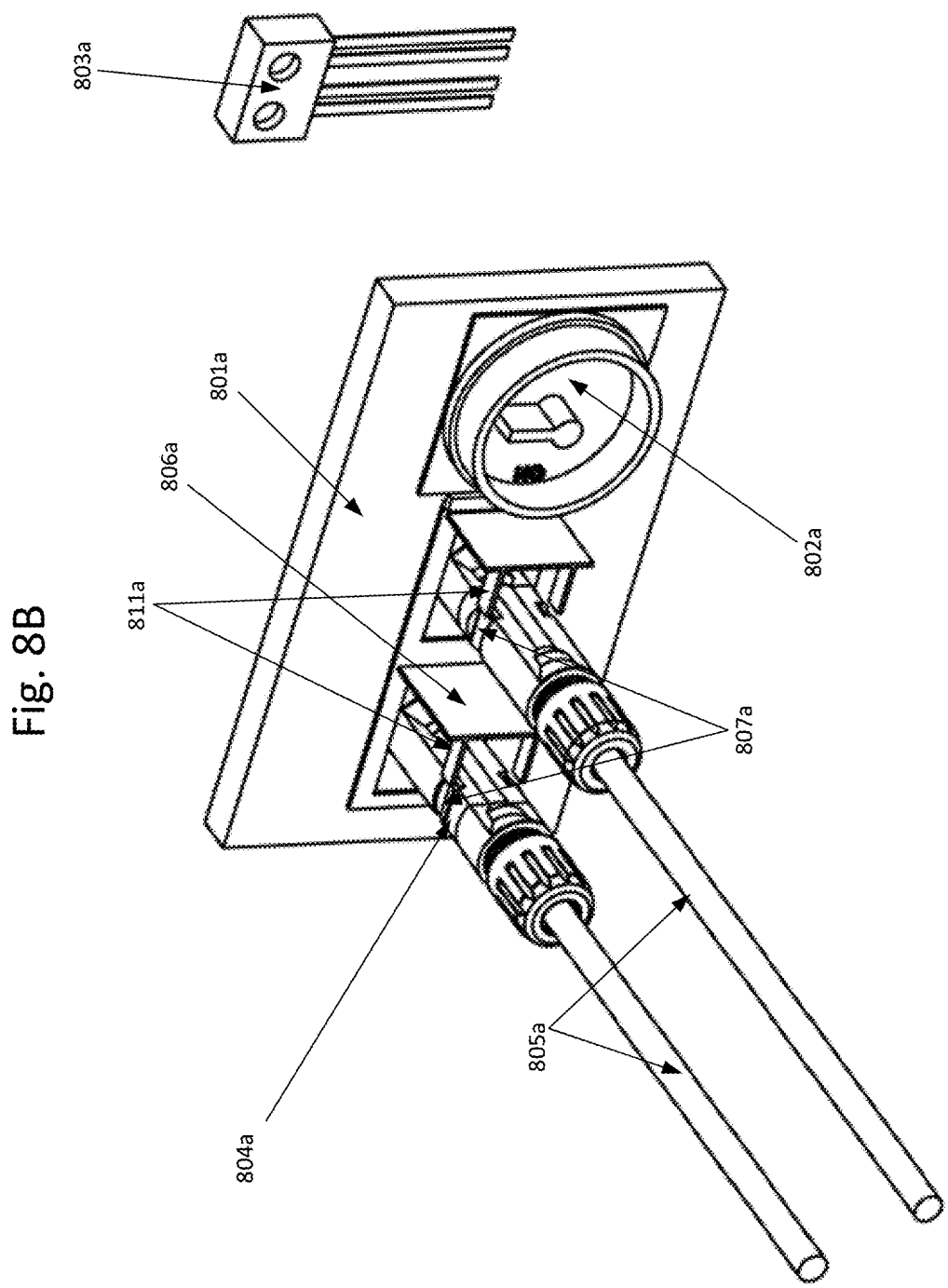
Figure 8C:
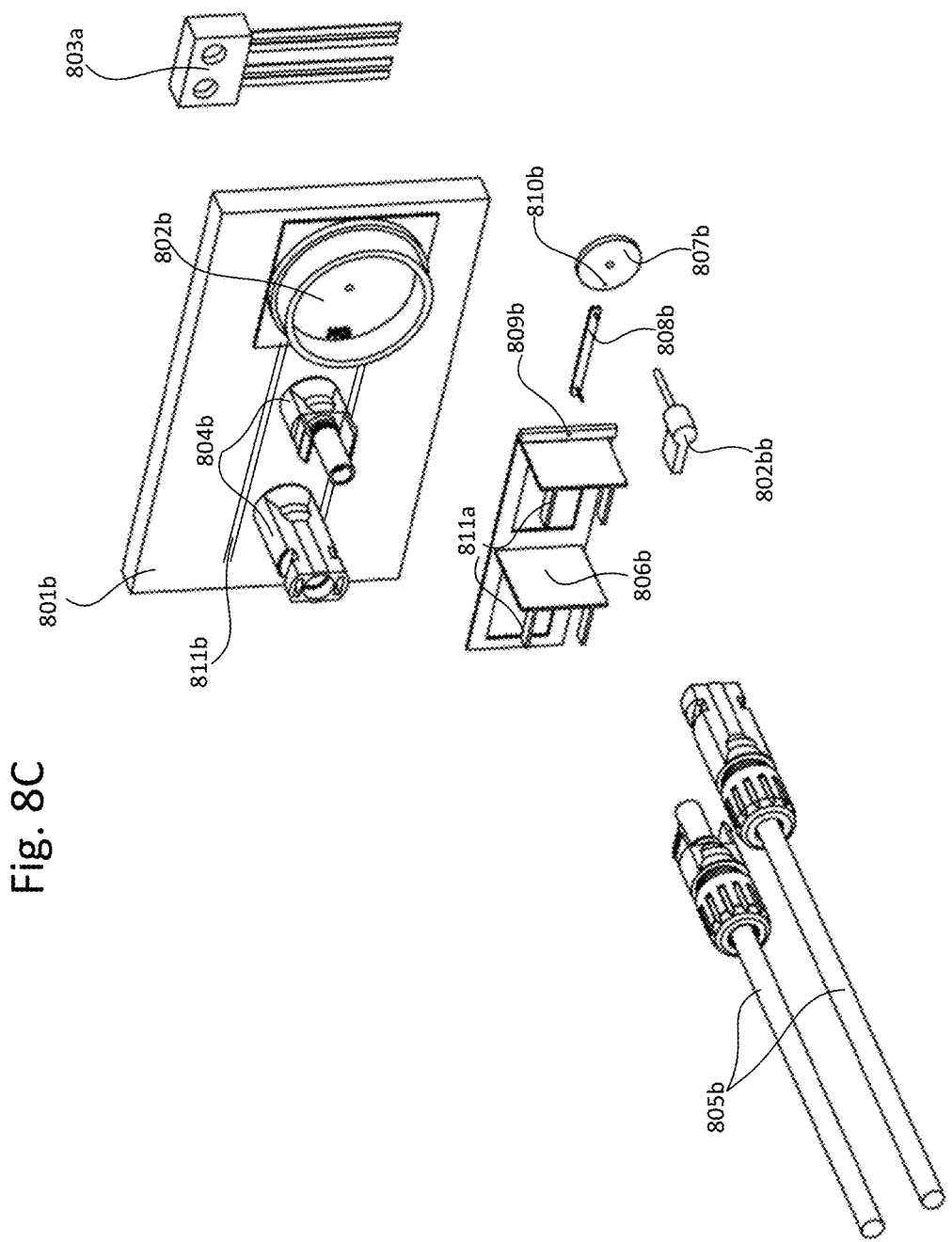
FIG. 8C illustrates an exploded view of parts of the No-Contact Switch of FIG. 8A-8B.

Reference is now made to FIG. 8C which shows the exterior of an enclosure featuring an exploded view of safety NCS 800 (shown in FIG. 8A) with a safety lock for electric cables according to illustrative embodiments. As mentioned in reference to FIG. 8A, safety NCS 800 may include an electric cable lock 806b. All of the components of FIG. 8C may be the same or similar to the suitable components of FIG. 8A. When switching switch 802b from one position to a second, lock 806b may cover connectors 804b, and by switching switch 802b from a second position to a first position, lock 806b may uncover connectors 804b. Covering connectors 804b may prevent unplugging cables 805b from enclosure 801b by mistake and at a dangerous time. Lock 806b may include shaft 808b and disc 807b. The position of lock 806b may be coupled to the position of switch 802b by shaft 808b which may connect to lock 806b at point 809b. Shaft 808b may also be connected to disc 807b which may be mounted on tab 802bb of switch 802b between the tab and enclosure 801b. When turning switch 802b from a first position to a second, disc 807b may turn together with knob or tab 802bb of switch 802b, and shaft 808b which may be connected to disc 807b at point 810b and may move according to the movement of disc 807b and tab 802bb. Lock 806b may be mounted on track 811b limiting its movement to being linear, and therefor when shaft 808b, which may be made of a solid material and its length being constant, moves according to the movement of disc 807b lock 806b may cover or uncover connectors 804a.

Reference is now again made to FIGS. 8A and 8B which show the exterior of an enclosure featuring safety NCS 800 with safety lock 806a configured to move between a locked position (FIG. 8A) and an unlocked position (FIG. 8B). FIG. 8A shows an example of one position of switch 802a and lock 806a covering connectors 804a of cables 805a, meaning that lock 806a is in the lock position. FIG. 8B shows an example of a second position of switch 802a and lock 806a not covering connectors 804a and tabs 807a of cables 805a, meaning that lock 806a is in the unlocked position.

Reference is now made to FIG. 9A which shows a power device 910 featuring an enclosure 911 with a Safety No-Contact Switch 912. In some embodiments, a photovoltaic system may include a DC/DC converter or a DC/AC inverter and may perform Maximum Power Point Tracking (MPPT) configured to try and optimize the power harvested from a power source coupled to power device 910. Power device 910 may include a DC/DC converter and/or a DC/AC inverter. Power device 910 may include connectors 913 and cables 914 which may be provided for the power input and output from power device 910. Cables 914 may be connected to other device or other power inputs and outputs, such as solar panels. For example, there may be a string of solar panels which are connected to one or more power devices configured to perform optimization of power harvested. In some embodiments power device 910 may include safety NCS 912. Safety NCS 912 may be the same or similar to safety NCS 102 of FIG. 1B.

In some embodiments, there may be a string of power sources (e.g. solar panels) that may be connected in a series and/or a parallel form. In some cases, there may be a desire to have the ability to disconnect one or more power source without disconnecting the entire string. One way of disconnecting one power source without disconnecting the entire string of the one power source, is by creating a bypass system to each or to every number of power sources, the bypass may be similar to the bypass mechanism which is used in a solar panel, where there is a bypass diode for every number of cells. In this scenario, there may be a need for great safety measures. One safety measure that may be taken is using safety NCS 912. For example, if there is a string of solar panels and a power device 910 mounted on each one of them, in a scenario that one panel or power device 910 fails, and there may be a need to turn the panel and/or the power device 910 off without disconnecting the entire string, safety NCS 912 may achieve this purpose. As mentioned in reference to FIG. 1A, there may be a very high current and/or voltage running through the string of solar panels, and when switching power device 910 to safe or OFF using safety NCS 912 there might be no direct contact between safety NCS 912 the electric circuit and the dangerous current and/or voltage.

Reference is now made to FIG. 9B which shows a power device 910 mounted on a solar panel 915. In some embodiments, there may be an importance to the physical location of NCS switch 912 in relation to its surroundings. FIG. 9B illustrates power device 910 mounted to a frame 916 of solar panel 915. There may be a number of reasons for mounting power device 910 on frame 916 of solar panel 915 as shown in FIG. 9B, one of which may be for convenience reasons. For example, if there is a need to disconnect power device 910 or solar panel 915, it may be easier to turn no contact switch 912 when it is at eyesight and/or within reach, meaning the frame of solar panel 915 may be the most accessible area of the panel. Solar panels are often installed as part of a setup and area that is designated for solar panels, and there may be more than one panel installed in proximity to each other. In order to maximize the number of panels in the area that the panels are installed in, the panels may be installed close to each other which may limit access to the panels. In addition to limited access to the panels, the panels may be installed in a way that one end of the panel is at a different height than the other end, causing one end to be higher than the other end. Because of this, it may be beneficial to have power device 910 at a more accessible area on solar panel 915 as well as a more accessible height. A second reason may be for safety. If the switch were to be closer to the center of solar panel 915, cables 914 may interfere with operating safety NCS 912.

There may also be mechanical reasons for mounting power device 910 on the frame of solar panel 915. One of the greater problems within the electronic development is the ability to control the temperature within the electronic device. In the case of power device 910, if the size were not an issue, it may be possible to use big heat sinks. In case that the size of the enclosure of power device 910 does matter, the size of the heat sink might not be able to be big enough in order to remove enough heat from within the enclosure which may cause a problem. One way to help with the problem of heat and help remove it from power device 910 without producing a big power device, may be by using the frame of solar panel 915 as a heat sink for power device 910. If power device 910 is positioned in a way that it is mounted on the frame of solar panel 915, the enclosure may be produced of a material that may allow the heat to transfer from within the enclosure to the external part of the frame faster than it is produced.

In some embodiments, a switch (e.g. a no-contact ON/OFF switch, a contact disconnect switch or a no-contact disconnect switch) may be integrated with a locking mechanism to increase safety and enable rapid and safe shutdown of a power device in case of a potentially dangerous condition. For example, switches disclosed herein may be mechanically designed and mounted on a power device enclosure in a way that may prevent or hinder physical access to potentially dangerous parts of the enclosure (e.g. by locking cables in place and/or restricting access to cables using an integrated physical cover).

Figure 10A:
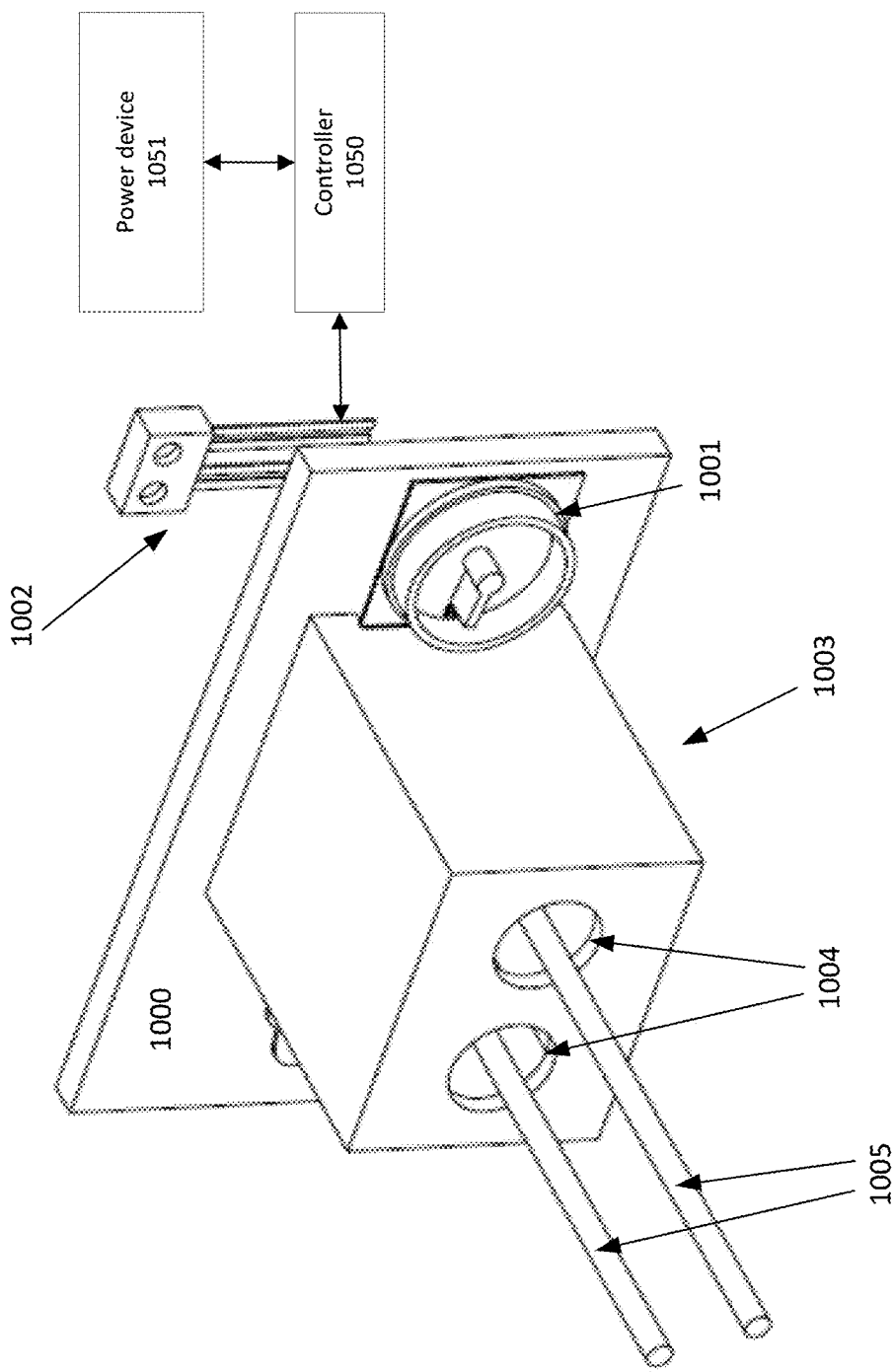

Reference is now made to FIG. 10A, which shows a perspective view of a disconnect switch (DS) 1003 according to an illustrative embodiment. Disconnect switch (DS) 1003 may be mounted on enclosure 1000 of a power device 1051, e.g. DC/DC converter, DC/AC converter, cabling combiner box, fuse box, monitoring device, etc. Power device 1051 may be electrically coupled to an electrical power source (e.g. a photovoltaic generator) or an electrical load (e.g. an electrical grid) through conductors 1005. DS 1003 may be designed to have a hollow content area, for example, designed in a shape of a box or a bowl (not shown) with a hollow content, with connectors 1007 of FIG. 10C disposed within the hollow content area of DS 1003 (and therefore not visible in FIG. 10A). DS 1003 may include openings 1004 designed to allow passage of conductors 1005, with DS 1003 partially or fully covering a connection between conductors 1005 and connectors housed within DS 1003.

Figure 10C:
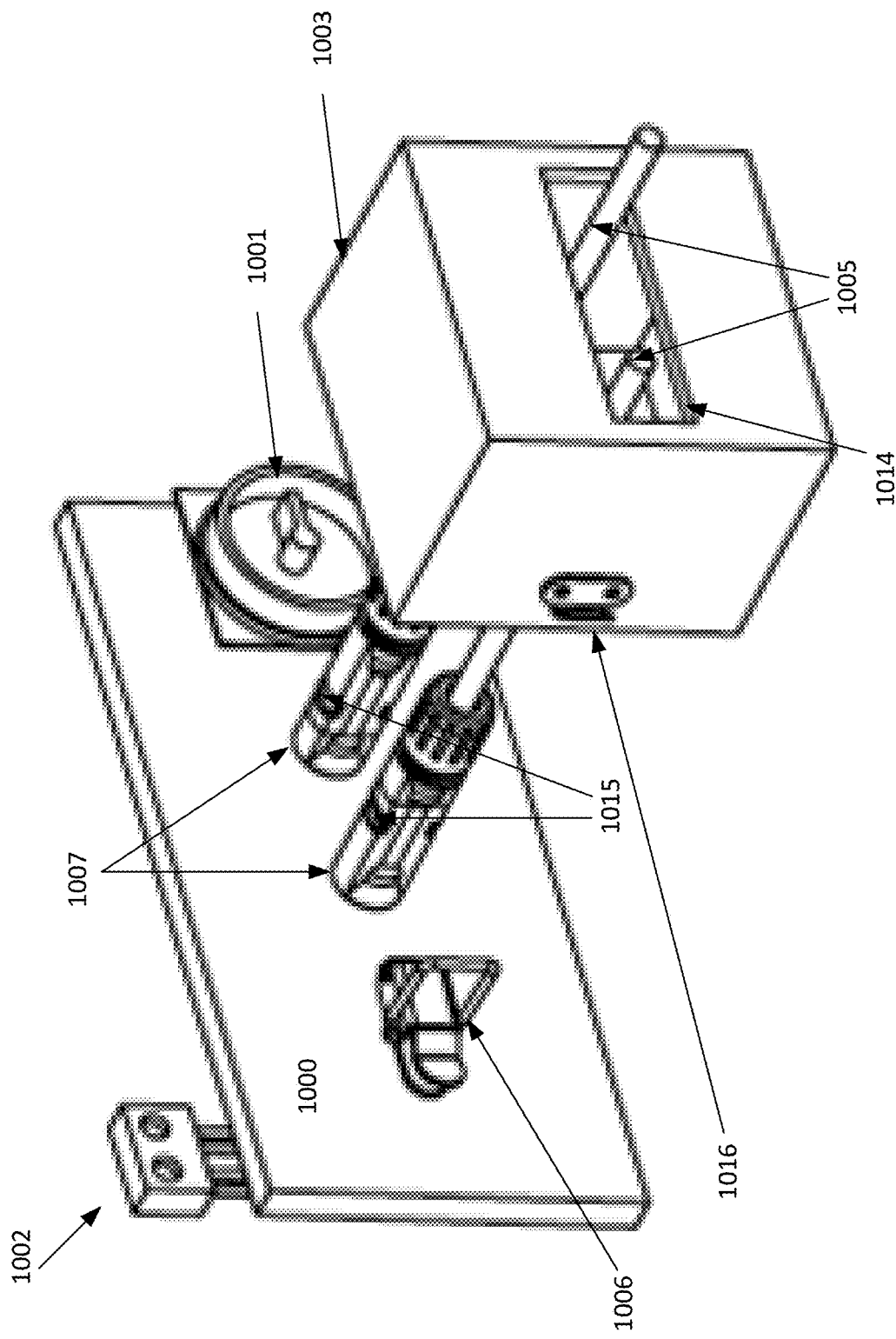
FIG. 10C illustrates a perspective view of a disconnect switch removed from an enclosure in accordance with one or more aspects of the present disclosure.

DS 1003 may be moved (e.g., moved along or removed from enclosure 1000) to expose a connection between conductors 1005 and connectors 1007, as shown in FIG. 10C. Sensor 1002 may measure a location or a change in the location of DS 1003 in accordance with various embodiments disclosed herein. Upon a change in a location of DS 1003, sensor 1002 may transmit a signal and/or measurement to controller 1050 which may then change an operation of power device 1051, for example, by shutting down power device 1051 or setting an operating point of power device 1051 to allow safe disconnection of conductors 1005 (Safe Mode). Controller 1050 may include, for example, a Digital Signal Processor (DSP), Application-Specific Integrated Circuit (ASIC), Field Programmable Logic Array (FPGA), Microcontroller, analog control circuit and the like.

The arrangement illustrated in FIG. 10A may provide certain safety advantages. For example, in photovoltaic installations it may be dangerous to disconnect photovoltaic conductors from power devices without ensuring that the power devices are shut down or set to a low voltage and current. The arrangement of FIG. 10A may inhibit or prevent disconnecting conductors 1005 from a power device (e.g., enclosed by enclosure 1000) without first triggering a shutdown of the power device (e.g., by moving or removing DS 1003).

Switch 1001 may be mounted on the exterior of enclosure 1000. Activation of switch 1001 may change a state of power device 1051. Switch 1001 may be similar to or the same as no-contact switches disclosed herein. For example, switch 1001 may be the same as or similar to rotary tab 103 of FIG. 1B. Switch 1001 may be configured to be used regularly as a control switch (e.g. an ON/OFF switch), with DS 1003 provided for use in case of a need to disconnect conductors 1005. In some embodiments, switch 1001 may be absent.

Reference is now made to FIG. 10B, which shows a disconnect switch 1003 arrangement according to an illustrative embodiment. In an embodiment, DS 1003 may be designed to be mechanically connected and disconnected from enclosure 1000 using a locking mechanism 1006. Locking mechanism 1006 maybe a latch, click-on lock, clicking tabs, push and turn device, etc. Locking mechanism 1006 may be mounted on DS 1003 and a latch 1016 may be mounted on to the exterior of enclosure 1000. Locking mechanism 1006 may be configured to latch onto latch 1016 when DS is locked. During assembly, conductors 1005 may be connected to connectors 1007, as shown in FIG. 10C. DS 1003 may be mounted over connectors 1007, restricting access to connectors 1007. Conductors 1005 may pass through openings 1004. Conductors 1005 may feature connectors such as MC4 PV cable connectors, which may include a safety mechanism. The safety mechanism of MC4 connectors may include a click 1015 between conductors 1005 and connectors 1007. By preventing or inhibiting access to connectors 1007, DS 1003 may serve as a safety mechanism, which may require dislocation (e.g., removal) in order to have access for unclicking and disconnecting conductors 1005 from connectors 1007.

Reference is now made to FIG. 10C, which shows a disconnect switch arrangement according to an illustrative embodiment. Conductors 1005 may pass through opening 1014, which may extend across part of DS 1003. Locking mechanism 1006 may be mounted on enclosure 1000 and configured to latch onto a latch 1016 mounted on DS 1003. Locking mechanism 1006 and latch 1016 may be designed to secure DS 1003 against enclosure 1000, while also enabling a fast and easy removal or dislocation of DS 1003 from enclosure 1000. While the various components of a disconnect switch are shown in a particular arrangement in FIG. 10C, such components may be provided in any number of configurations. For example, switch 1001 is shown on a side of DS 1003 opposite of locking mechanism 1006. However, in other arrangements switch 1001 may be on a same side or a proximate side as locking mechanism 1006. Another arrangement might not include switch 1001. Latch 1016 may be mounted on any exterior side of disconnect switch 1003 and locking mechanism 1006 may be mounted on enclosure 1000 at an appropriate position with regard to latch 1016.

Figure 10D:
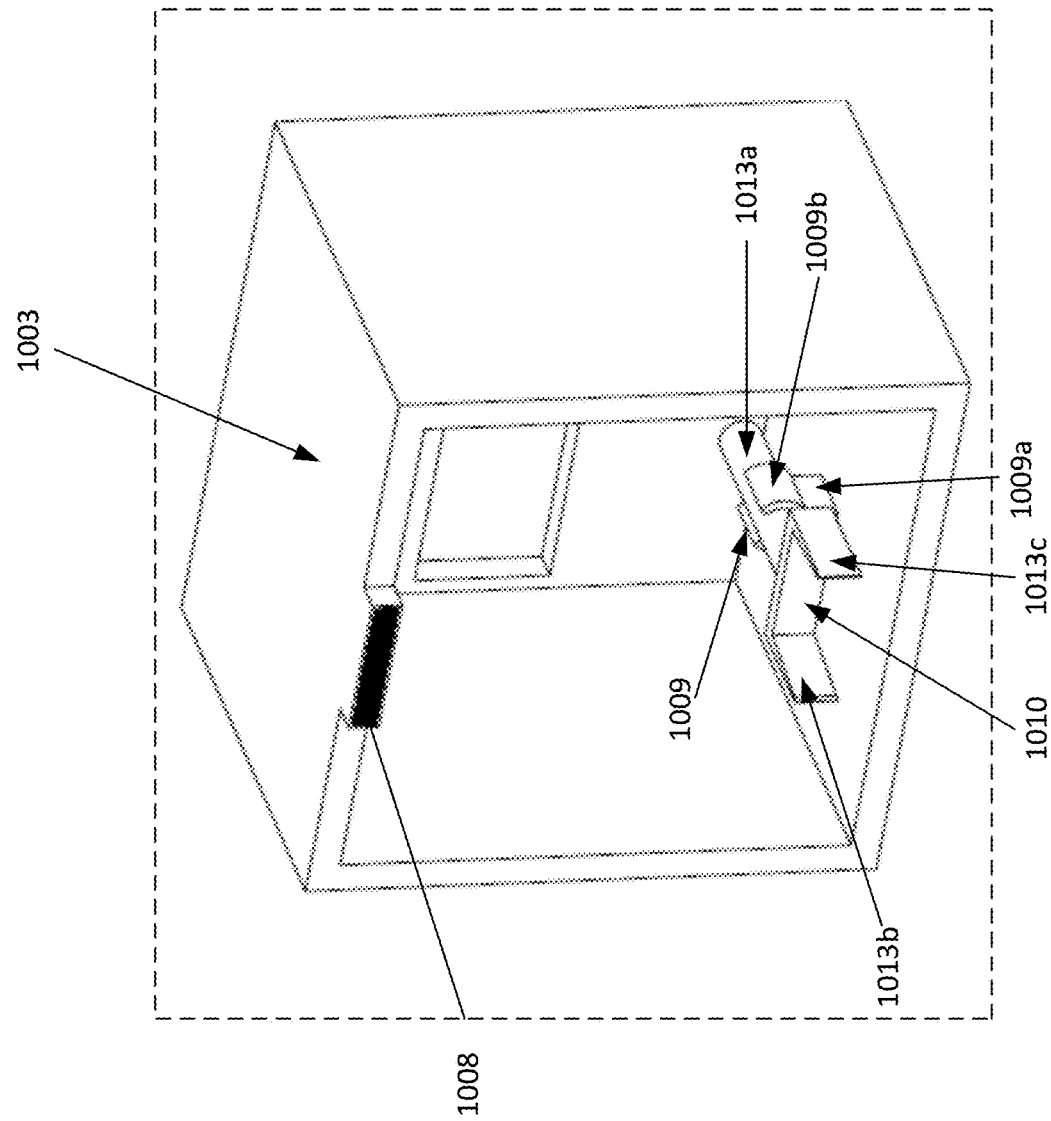
FIG. 10D illustrates a perspective view of a disconnect switch in accordance with one or more aspects of the present disclosure.

Reference is now made to FIG. 10D, which depicts aspects of disconnect switch 1003 according to illustrative embodiments. DS 1003 may be connected to and/or partially or fully covered by one or more agents that are able to be sensed, such as reflective agent 1008. Reflective agent 1008 may include pads, paint, plastic or rubber covers, or other agents which may be connected DS 1003. Sensor 1002 may be placed in the interior of enclosure 1000, in proximity to the inner surface of enclosure 1000 and DS 1003, such that when DS 1003 is in a first position, as shown in FIG. 10B, reflective agent 1008 is in close proximity to sensor 1002, and when DS is in a second position, as shown in FIG. 10C, reflective agent 1008 may be insensible or sensed in a different magnitude or manner by sensor 1002. Sensor 1002 may be configured to detect a measurable property of reflective agent 1008, which may be an entity not physically coupled to sensor 1002. Sensor 1002 may be a radiation sensor configured to detect radiation at a specific wavelength or across a spectrum of wavelengths. In some embodiments, 1008 may be a magnet, and sensor 1002 may be a magnetic sensor configured to detect and/or respond to the strength or polarization of a magnetic field. Upon dislocation of DS 1003 (e.g., removal from enclosure 1000), sensor 1002 may detect a change in strength or polarization of a magnetic field.

In an embodiment, sensor 1002 may include a transmitting part and a receiving part. The transmitting part may induce a magnetic field towards enclosure 1000, and the receiving part facing enclosure 1000 may comprise an inductor carrying an induced current of a magnitude dependent on a magnetic force (according to Lenz's Law). The magnetic force may depend on the size of the transmitter part of sensor 1002 and on reflective agent 1008. The transmitting part of sensor 1002 may be a magnet of a certain magnitude, and reflective agent 1008 may be a magnetized agent. When DS 1003 is in a first position (e.g., connected to the exterior of enclosure 1000 as shown in FIG. 10A), a distance between the transmitting part of sensor 1002 and reflective agent 1008 may create a magnetic force of a first magnitude and induce an inductor current having a first magnitude. When DS 1003 is in a second position (e.g., disconnected and/or at a distance from the exterior of enclosure 1000, as shown in FIG. 10C) the distance between the transmitter part of sensor 1002 and reflective agent 1008 may change, which may cause the magnetic force applied the inductor to change, causing the induced current to change.

Sensor 1002 may provide the measured magnitude of current, voltage or power to a controller (e.g., controller 1050 of FIG. 10A) controlling an electrical circuit (e.g., power device 1051 of FIG. 10A), with the controller configured to respond to a change in the magnetic force magnitude measured by sensor 1002.

In some embodiments, a number of reflective agents the same or similar to reflective agents 1008 and/or a number of sensors the same or similar to sensor 1002 may be used (not explicitly shown). Having a plurality of reflective agents and a plurality of sensors may help filter noise. Noise may be generated by external magnetic objects located in proximity to power device 1051. The controller 1050 may be configured to respond to a change detected by more than one sensor, reducing the chances of mistaken activation of the switch.

In some embodiments, sensor 1002 may be a radiation sensor, with reflective agent 1008 having reflective characteristics of a first kind. Enclosure 1000 may include a window similar to window 308 of FIG. 3D. Sensor 1002 may transmit a beam of a certain magnitude in the direction of reflective agent 1008, and the beam may be reflected back from reflective agent 1008 toward the receiver part of sensor 1002 and received at a certain magnitude depending on the characteristics and position of reflective agent 1008. For example, if DS 1003 is in a first position (e.g., connected and/or linked to the exterior of enclosure 1000), reflective agent 1008 may be against the window, and a beam transmitted from the transmitter part of sensor 1002 may be reflected off reflective agent 1008 back towards the receiving part of sensor 1002 at a first magnitude. If DS 1003 is in a second position (e.g., disconnected and/not linked to the exterior of enclosure 1000), a beam transmitted from the transmitter part of sensor 1002 may be reflected back towards the receiver part of sensor 1002 at a second magnitude. Sensor 1002 may output an electric signal to a controller, and in response to the signal, the controller may change the electrical status of a power device (e.g., power device 1051).

Referring back to FIG. 10D, DS 1003 may house a tool 1010. Tool 1010 may include a handle 1013a, a first prong 1013b and a second prong 1013c. A first prong 1013b may protrude from the handle. Parallel to the first prong may be a second prong 1013c. Referring now to FIG. 10E, the prongs may be configured to slide onto connectors 1007 and press on the clicking mechanism between conductors 1005 and connectors 1007, so that when tool 1010 is placed on connectors 1007 and pressing on the clicking mechanism, conductors 1005 may be disconnected from connectors 1007.

Referring back to FIG. 10D, tool 1010 may be held in DS 1003 with a holder 1009. Holder 1009 may protrude from one of the sides of DS 1003. Holder 1009 may include a base section 1009a and a holding section 1009b. Base section 1009a may distance holding section 1009b from DS 1003. Holding section 1009b may be configured to keep tool 1010 from moving or falling out of DS 1003. In a first embodiment, tool 1010 may slide in and out of holder 1009. In a second embodiment, tool 1010 may snap in and out of holder 1009.

According to illustrative embodiments disclosed herein, a disconnect switch may be combined with a no-contact ON/OFF switch. In some embodiments, some of the potential advantages of a disconnect switch (e.g., having a switch restricting access to cable connectors while a power device is operating) may be combined with an ON/OFF switch which might not be a no-contact switch.

Figure 10F:
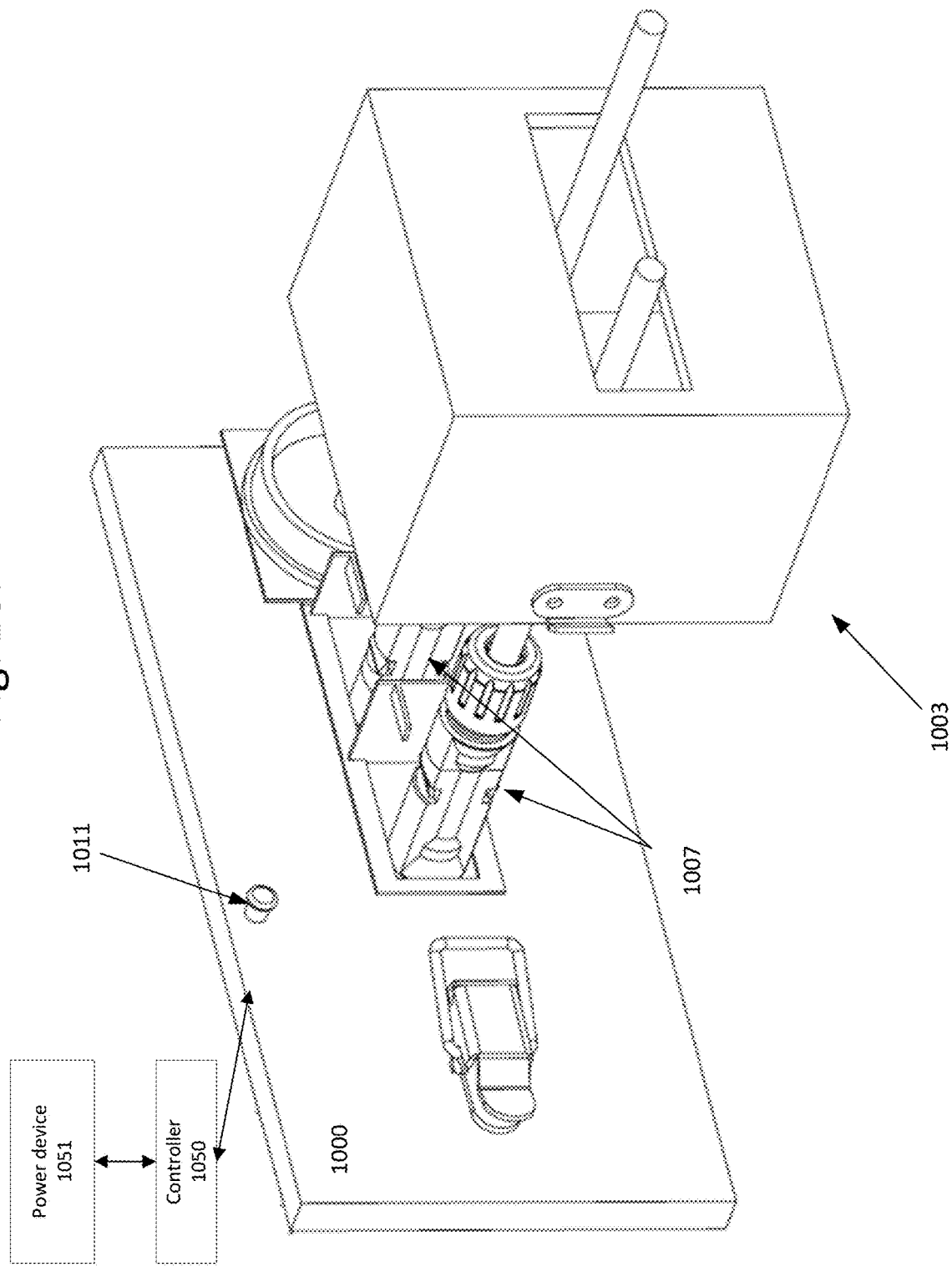
FIG. 10F illustrates a perspective view of a disconnect switch removed from an enclosure with a button in accordance with one or more aspects of the present disclosure.

Reference is now made to FIG. 10F, which shows a disconnect switch arrangement according to illustrative embodiments. According to some embodiments, DS 1003 may maintain a button 1011 in a first position when mounted on enclosure 1000. In some embodiments, button 1011 may penetrate enclosure 1000. When in a first position (e.g., compressed inwards), button 1011 may close a circuit connected to a controller 1050, and when in a second position (e.g., not compressed inwards) button 1011 may open the circuit connected to controller 1050. In response to a change in the position of the button, controller 1050 may change an operating state of power device 1051. DS 1003 may restrict access to connectors 1007 coupled to power device 1051, and by designing and disposing button 1011 such that removing DS 1003 changes a position of button 1011, power device 1051 may be turned off when DS 1003 is removed, which may provide increased safety (e.g., it might not be possible to disconnect connectors 1007 when power device 1051 is in the ON state).

Figure 11A:
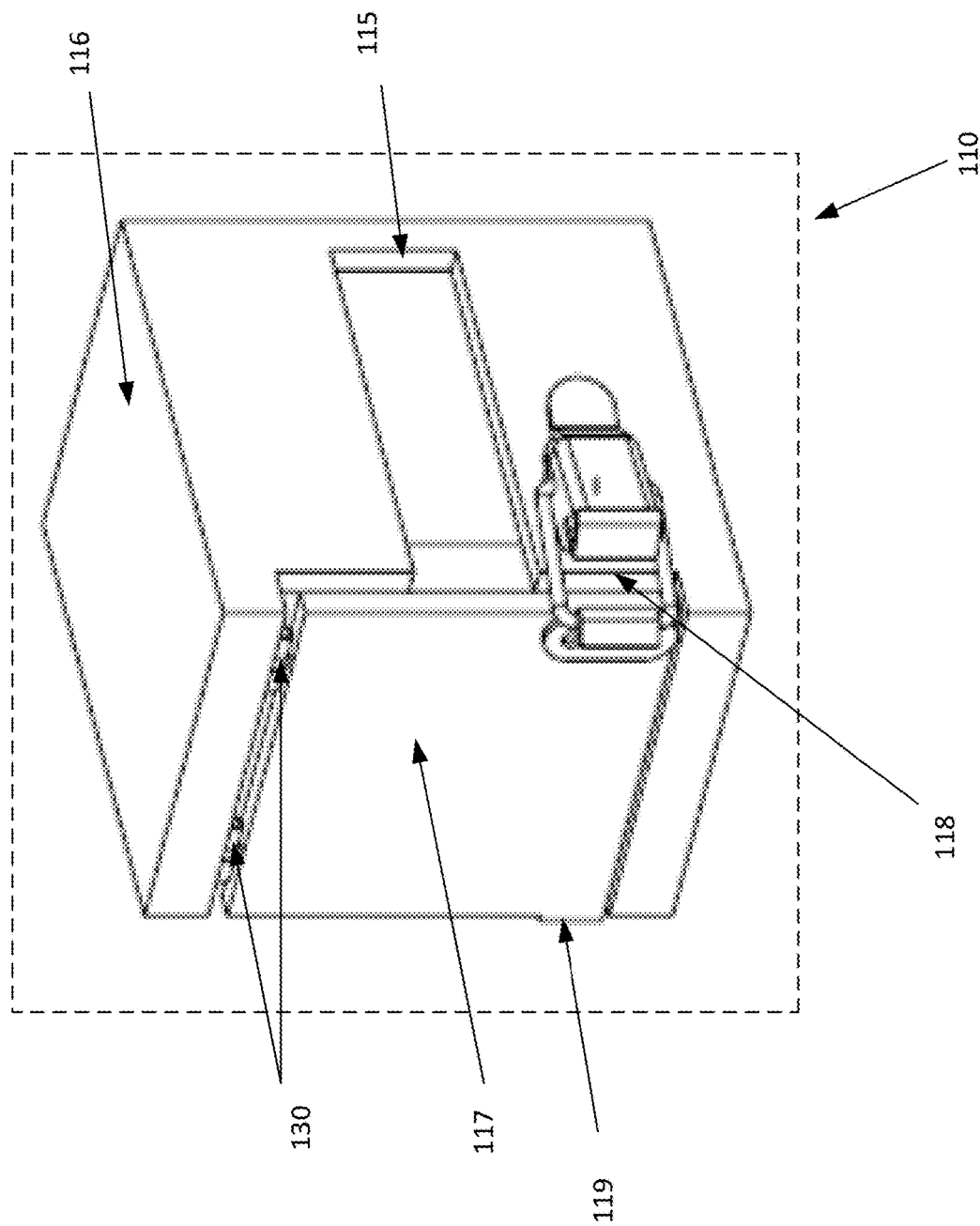
FIG. 11A illustrates a perspective view of a disconnect switch with a door in accordance with one or more aspects of the present disclosure.

Reference is now made to FIG. 11A which shows a perspective view of a disconnect switch (DS) 110. DS 110 may include a door 117 which may connect to cover 116 using a connecting mechanism 130. Connecting mechanism 130 may be a set of hinges, joints, a sliding door, etc. Door 117 may lock to cover 116 with a locking mechanism 118. Locking mechanism 118 may be the same as or similar to locking mechanism 1006 of FIG. 10B. Locking mechanism 118 may include a first and second section, a first section mounted on door 117 and a second section mounted on to cover 116. Cover 116 may include an opening 115 for conductors (for example, conductors 1005 of FIG. 10A) and may house respective connectors to conductors. Door 117 of DS 110 may be connected to or partially or fully covered by one or more agents that are able to be sensed, such as reflective agent 119. Reflective agent 119 may include pads, paint, plastic or rubber covers, or other agents which may be connected to door 117.

Reference is now made to FIG. 11B which shows a disconnect switch (DS) 110 arrangement mounted on an enclosure 111 of a power device 1151 according to illustrative embodiments. DS 110 may be mounted on the exterior side of enclosure 111, housing conductors 114 and respective connectors 132. Conductors 114 may be coupled to another electronic device. Conductors 114 may be MC4 cables and may include a safety mechanism. The safety mechanism of MC4 conductors and connectors may include a click lock. By restricting or inhibiting access to the connectors, DS 110 may serve as a safety mechanism, which may require dislocation (e.g. opening) in order to have access for unclicking and disconnecting conductors 114 from connectors 132. Opening cover 116 may allow access to the clicking mechanism between conductors 114 and their respective connectors 132, while closing cover 116 may restrict access to the clicking mechanism between conductors 114 and their respective connectors 132.

Figure 11C:
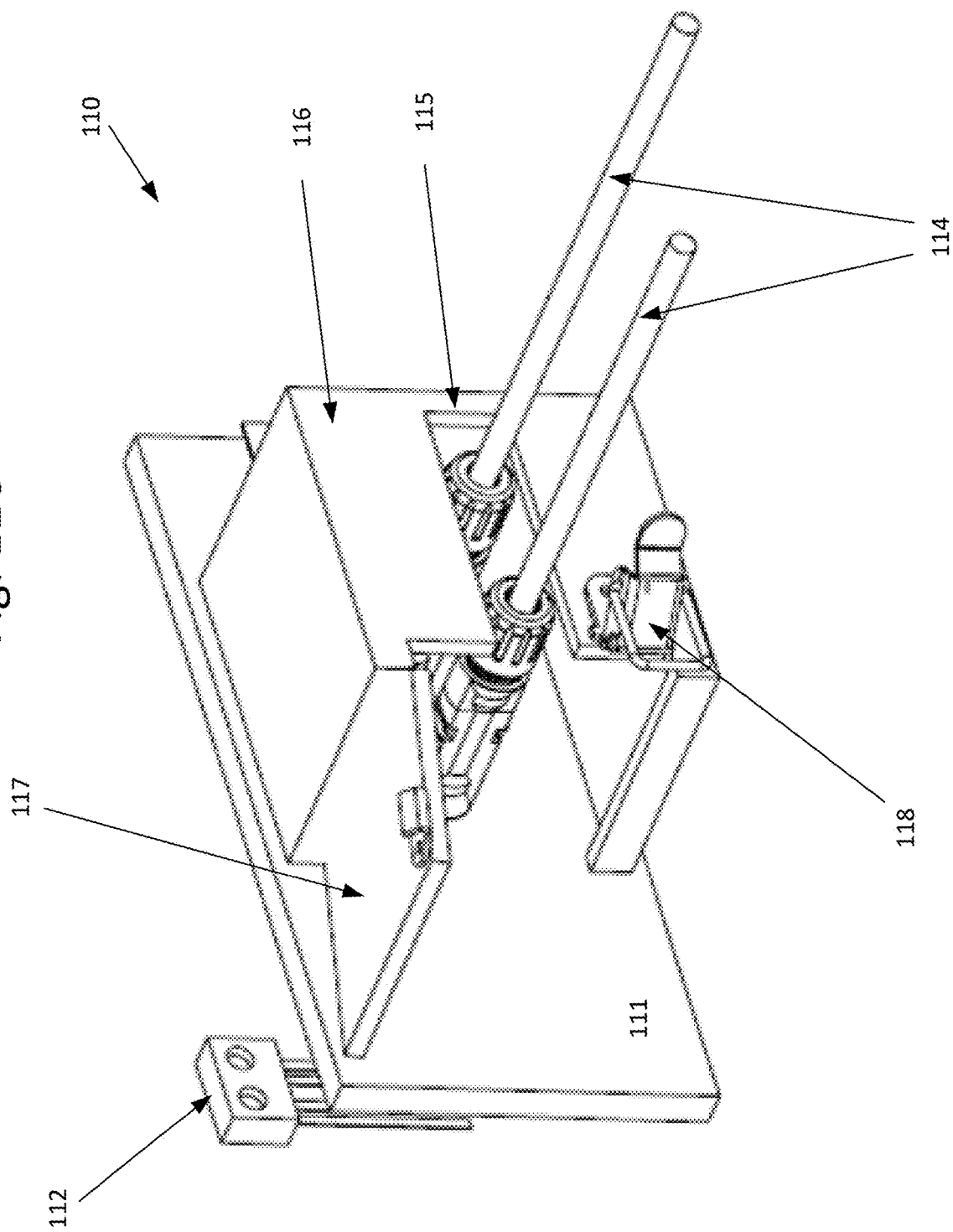
FIG. 11C illustrates a perspective view of a disconnect switch mounted on an enclosure with an opened door in accordance with one or more aspects of the present disclosure.

Sensor 112 may be placed in the interior side of enclosure 111, in proximity to the inner surface of enclosure 111 and door 117, such that when door 117 is in a first position (e.g., as shown in FIG. 11B), reflective agent 119 is in close proximity to sensor 112, and when door 117 is in a second position (e.g., as shown in FIG. 11C), reflective agent 119 may be insensible or sensed in a different magnitude or manner by sensor 112. Sensor 112 may be a radiation sensor configured to detect radiation at a specific wavelength or across a spectrum of wavelengths. In certain embodiments, reflective agent may be a magnet and sensor 112 may be a magnetic sensor configured to detect and/or respond to the strength or polarization of a magnetic field. Upon dislocation of door 117 and/or DS 110 (e.g., removal of DS 110 from enclosure 111), sensor 112 may detect a change in strength or polarization of a magnetic field.

A controller 1150 may be coupled to sensor 112 so that depending on the position of reflective agent 119 the controller may change the electrical status of power device 1151 enclosed by enclosure 111. For example, when door 117 is closed and locked, sensor 112 may sense a first magnetic field and output an electrical signal to controller 1150. Controller 1150 may close a switch according to the output of sensor 112 and turn on power device 1151 enclosed by enclosure 111. When door 117 is opened, sensor 112 may sense a second magnetic field and output a second electrical signal to controller 1150. According to the second electrical signal from sensor 112, controller 1150 may open a switch and turn off power device 1151 enclosed by enclosure 111. DS 110 may include a number of reflective agents and/or a number of sensors. Including more than one reflective agent and sensor may be provide various safety advantages. For example, having more than one reflective agent and sensor may cause a more accurate read of the controller, and also may prevent external objects from being sensed as a reflective agent.

Sensor 112 may provide the measured magnitude of current, voltage or power to controller 1150 controlling an electrical circuit (e.g., power device 1151 of FIG. 11A), with the controller configured to respond to a change in the magnetic force magnitude measured by sensor 112.

DS 110 may be moved (e.g., moved along or removed from enclosure 111) to expose a connection between conductors 114 and their connectors. Sensor 112 may measure a location or a change in the location of door 117 in accordance with various embodiments disclosed herein with regard to FIG. 11D. Upon a change in a location of door 117, sensor 112 may transmit a signal and/or measurement to controller 1150 which may then change an operation of power device 1151 enclosed in enclosure 111, for example, by shutting down power device 1151 or setting an operating point of power device 1151 to allow safe disconnection of conductors 114.

Reference is now made to FIG. 11C, which shows a disconnect switch arrangement according to illustrative embodiments. Conductors 114 may pass through opening 115, which may extend across part of DS 110. Locking mechanism 118 may include a first part mounted on door 117 and a second part attached to cover 116. The first and second parts of locking mechanism 118 may be designed to secure door 117 against cover 116, while enabling a fast and easy removal or dislocation of door 117 and DS 110, e.g., in case of a potentially dangerous situation.

Reference is now made to FIG. 11D, which shows a perspective view of a disconnect switch door 117, according to illustrative embodiments. Door 117 may include connecting mechanism 130 which may connect to a DS cover (for example, cover 116). Reflective agent 119 may be positioned on the side of door 117 which is closest to enclosure 111 of FIG. 11A. Reflective agent 119 may be positioned close to the corner of door 117 for production reasons. In some embodiments, door 117 may include multiple reflective agents which may be sensed by multiple sensors (e.g., disposed on or near cover 116) configured to detect a change in the position of door 117.

Figure 12:
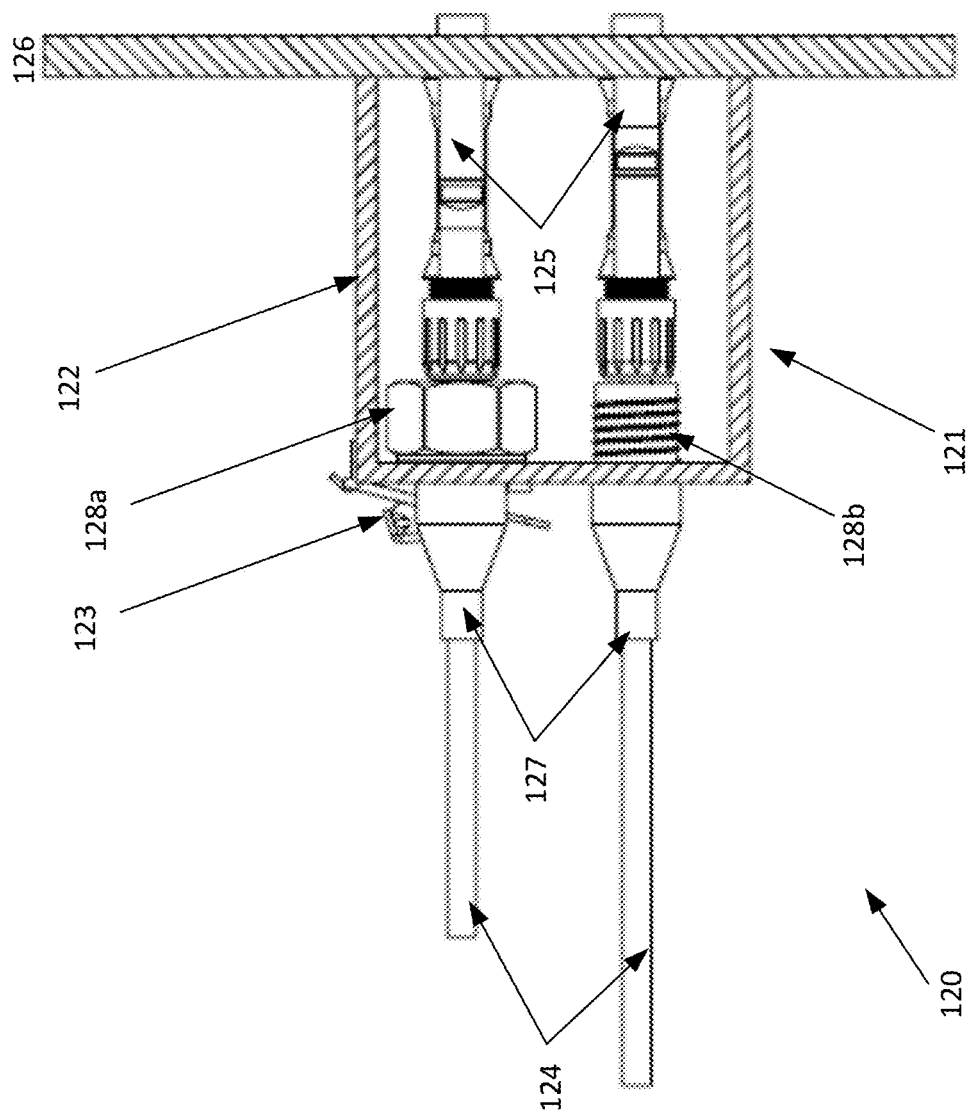
FIG. 12 illustrates a side sectional view of a disconnect switch mounted on an enclosure with a locked door in accordance with one or more aspects of the present disclosure.

Reference is now made to FIG. 12, which shows a side sectional view of a disconnect switch 120 according to illustrative embodiments. In some embodiments, a disconnect switch (DS) 120 may include a cover 121, a door 122 and a connecting mechanism 123. Cover 121 may house cables 124 and respective connectors 125 connected to cables 124. DS 120 may be mounted on an exterior surface of an enclosure 126. Cables 124 may be covered by and protected by conduits 127. Conduits 127 may be coupled (e.g., mechanically attachable) to cover 121. In some embodiments conduits 127 may be connected to cover 121 by nuts 128a (in order to show the different parts, FIG. 12 shows one nut 128a and one area 128b on a conduit where a nut 128a is designed to screw on to) which may screw onto conduits 127 in the interior of cover 121. Conduits 127 may have a threaded area 128b allowing respective "screw-on" nuts 128a to connect conduits 127 to cover 121. According to some embodiments, door 122 may hermetically seal DS 120 when connecting mechanism 123 and conduits 127 are connected appropriately. In some embodiments, conduits 127 may be rigid, which may make it difficult to remove cover 121 from enclosure 126. Some embodiments may include using door 122 for activation of DS 120 and/or for gaining access to connectors 125 without removing cover 121 from enclosure 126. In some embodiments, conduits 127 may be flexible and cover 121 may disconnect from enclosure 126 and allow access to connectors 125.

What is claimed is:

1. A method comprising:
mounting at least one reflective agent on a door;
connecting the door to a cover on an exterior of a power device enclosure using a connecting mechanism, wherein the door is movable from an open position to a closed position such that:
when the door is in the open position, the at least one reflective agent is in a detection range of a radiation sensor positioned on an interior of the power device enclosure and outside of the cover; and
when the door is in the closed position, the at least one reflective agent is outside of the detection range of the radiation sensor;
transmitting a beam using the radiation sensor;
in response to a change in position of the door, detecting a change in location of the surface at least one reflective agent with the radiation sensor;
reading a signal from the radiation sensor by a controller; and
changing a state of a power device according to instructions from the controller, said instructions being configured according to the signal of the radiation sensor.

2. The method of claim 1, further comprising setting, by the controller, the power device to an ON state or an OFF state depending on the signal from the radiation sensor.

3. The method of claim 1, further comprising setting, by the controller, the power device to a SAFE MODE or to a NON-SAFE MODE depending on the signal from the radiation sensor.

4. The method of claim 1, further comprising setting the power device enclosure to a locked state or an unlocked state, wherein the setting is performed by a locking mechanism.

5. The method of claim 4, wherein the locking mechanism includes a latch.

6. The method of claim 1, wherein the power device is a direct current (DC) to alternating current (AC) converter or a DC to DC converter.

7. The method of claim 1 wherein the power device is configured to perform Maximum Power Point Tracking (MPPT).

8. An apparatus comprising:
a power device enclosure;
a power device enclosed by the power device enclosure;
a cover, mounted on an exterior of the power device enclosure;
a door comprising:
at least one reflective agent, and
a connecting mechanism,
wherein the door is connected to the cover with the connecting mechanism and wherein the door is movable from an open position to a closed position such that:
when the door is in the open position, the at least one reflective agent is in a detection range of a radiation sensor positioned on an interior of the power device enclosure and outside of the cover; and
when the door is in the closed position, the at least one reflective agent is outside of the detection range of the radiation sensor;

the radiation sensor configured to detect a change in location of the at least one reflective agent and output a signal depending on the change in location of the at least one reflective agent; and
a controller configured to change a state of the power device according to the signal.

9. The apparatus of claim 8, wherein the radiation sensor is positioned on a side of the door proximate to the power device enclosure.

10. The apparatus of claim 8, wherein the power device comprises a power converter for coupling to a photovoltaic system, and wherein the power converter is selected from a DC/DC converter or a DC/AC inverter.

11. The apparatus of claim 8, wherein the controller is configured to set the power device to an ON state or an OFF state depending on the signal from the radiation sensor.

12. The apparatus of claim 8, wherein the contoller is configured to set the power device to a SAFE MODE or to a NON-SAFE MODE depending on the signal from the radiation sensor.

13. The apparatus of claim 8, further comprising a locking mechanism configured to set the power device enclosure to a locked state or an unlocked state.

14. The apparatus of claim 13, wherein the locking mechanism includes a latch.

15. The apparatus of claim 8, wherein the power devices is configured to perform Maximum Power Point Tracking (MPPT).

16. The apparatus of claim 8, wherein the exterior of the power device enclosure comprises a plurality of connectors to which a plurality of conductors is connected, and wherein the plurality of conductors include:
a safety mechanism configured to prevent accidentally disconnecting the plurality of conductors from the plurality of connectors, wherein the safety mechanism comprises a click lock.

17. The apparatus of claim 8, wherein the exterior of the power device enclosure comprises a plurality of connectors to which a plurality of conductors is connected; and wherein, when the door is in the closed position, the plurality of conductors and the plurality of connectors are inaccessible from the exterior of the power device enclosure and, when the door is in the open position, the plurality of conductors and the plurality of connectors are accessible from the exterior of the power device enclosure.

18. The apparatus of claim 8,
wherein the radiation sensor comprises a transmitting part and a receiving part,
wherein the transmitting part transmits a beam of radiation at a specific wavelength or across a spectrum of wavelengths, and
wherein the at least one reflective agent is configured to at least partially reflect back the beam of radiation transmitted by the transmitting part of the radiation sensor.

19. The apparatus of claim 8, wherein the connecting mechanism comprises at least one of: a set of hinges, joints, and a sliding door.

20. The apparatus of claim 8, wherein the at one reflective agent includes a plurality of reflective agents, and wherein the apparatus further comprises a plurality of radiation sensors.

* * * * *